United States Patent
Zheng et al.

(10) Patent No.: US 11,067,654 B2
(45) Date of Patent: Jul. 20, 2021

(54) SYSTEMS AND METHODS FOR DETERMINING FIELD MAP

(71) Applicant: SHANGHAI UNITED IMAGING HEALTHCARE CO., LTD., Shanghai (CN)

(72) Inventors: Yuan Zheng, Houston, TX (US); Yongquan Ye, Houston, TX (US); Yu Ding, Houston, TX (US)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 0 days.

(21) Appl. No.: 16/750,012

(22) Filed: Jan. 23, 2020

(65) Prior Publication Data

US 2020/0341091 A1 Oct. 29, 2020

(30) Foreign Application Priority Data

Apr. 29, 2019 (CN) .......................... 201910357668.4

(51) Int. Cl.
*G01R 33/50* (2006.01)
*G01R 33/24* (2006.01)
*G01R 33/56* (2006.01)

(52) U.S. Cl.
CPC .......... *G01R 33/50* (2013.01); *G01R 33/243* (2013.01); *G01R 33/5602* (2013.01)

(58) Field of Classification Search
CPC ... G01R 33/50; G01R 33/243; G01R 33/5602
See application file for complete search history.

(56) References Cited

PUBLICATIONS

E. M. Haacke et al., Susceptibility Weighted Imaging (SWI), Magnetic Resonance in Medicine, 52(3):612-618, 2004.
E. M. Haacke et al., Quantitative Susceptibility Mapping: Current Status and Future Directions, Magnetic Resonance Imaging, 33(1):1-25, 2015.
Rieke V. et al., MR Thermometry, Journal of Magnetic Resonance Imaging, 27(2):376-390, 2008.
Juchem C. et al., Magnetic Field Homogenization of the Human Prefrontal Cortex With a Set of Localized Electrical Coils, Magnetic Resonance in Medicine, 63(1):1 71-180, 2010.
Abdul-Rahman H. et al., Robust Three-Dimensional Best-path Phase-Unwrapping Algorithm that Avoids Singularity Loops, Applied Optics, 48(23):4582-4596, 2009.
Robinson S. et al., A Method for Unwrapping Highly Wrapped Multi-echo Phase Images at Very High Field: Umpire, Magnetic Resonance in Medicine, 72(1):80-92, 2014.

*Primary Examiner* — G. M. A Hyder
(74) *Attorney, Agent, or Firm* — Metis IP LLC

(57) ABSTRACT

The present disclosure is related to systems and methods for determining a field map in magnetic resonance imaging (MRI). The method includes obtaining at least three images. Each may be acquired at one of at least three echo times by an MRI device via scanning a subject. The at least three echo times may define multiple pairs of adjacent echo times. Each of the multiple pairs of adjacent echo times may have a time difference between the adjacent echo times. At least two of the time differences may be different. The method includes determining a target function with an off-resonance frequency as an independent variable. The target function includes a phase deviation term and a sparsity constraint term.

20 Claims, 9 Drawing Sheets

700

┌─────────────────────────────────────────────┐
│ Determining an estimated phase difference with an off- │
│ resonance frequency as an independent variable based on a │ ~ 710
│ time difference corresponding to each pair of adjacent echo │
│ times │
└─────────────────────────────────────────────┘
                        ↓
┌─────────────────────────────────────────────┐
│ Determining an actual phase difference based on values of │ ~ 720
│ corresponding pixels in two images acquired at the each pair of │
│ adjacent echo times │
└─────────────────────────────────────────────┘
                        ↓
┌─────────────────────────────────────────────┐
│ Determining a phase deviation corresponding to the each pair │ ~ 730
│ of adjacent echo times based on the estimated phase │
│ difference and the actual phase difference │
└─────────────────────────────────────────────┘

FIG. 7

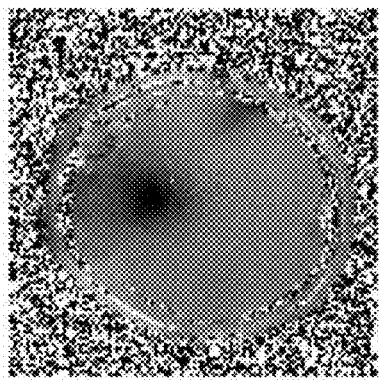 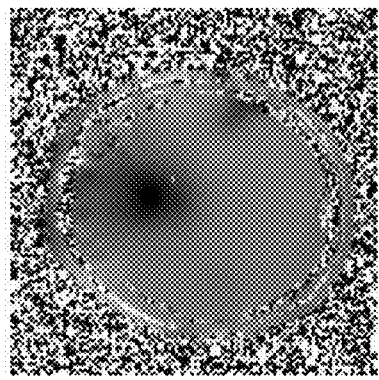 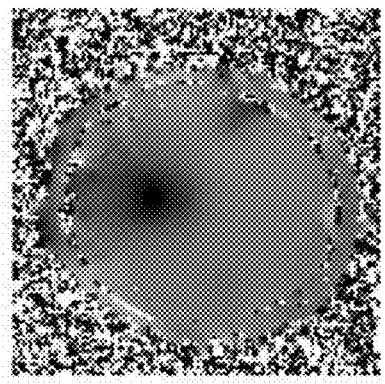
901　　　　　　　　902　　　　　　　　903
FIG. 9

SYSTEMS AND METHODS FOR DETERMINING FIELD MAP

CROSS-REFERENCE TO RELATED APPLICATIONS

This application claims priority of Chinese Patent Application No. 201910357668.4, filed on Apr. 29, 2019, the contents of which are hereby incorporated by reference.

TECHNICAL FIELD

This disclosure generally relates to magnetic resonance imaging (MRI), and more particularly, relates to systems and methods for determining a field map in MRI.

BACKGROUND

Magnetic resonance imaging (MRI) is an imaging technique used in radiology to capture images of an anatomy or a physiological process of a subject (e.g., a patient, or a body part thereof). MRI scanners use strong magnetic fields, radio waves, and field gradients to generate images of an inner structure of a subject without involving X-rays or the use of ionizing radiation. Each pixel in an MRI image includes phase information and magnitude information reflecting an interaction between a subject and magnetic fields generated by MRI scanners. A field map may be generated based on phase information associated with multiple MRI images. The field map is important for magnetic susceptibility weighted imaging (SWI), quantitative magnetic susceptibility imaging, temperature imaging, and/or shimming calibration in MRI.

The conventional method to determine the field map is to collect two images at two different echo times. The field map (also expressed as an off-resonance frequency) may be determined by dividing a phase difference between the two images by a time difference between the two echo times. Because a range of phase values which can be measured in MRI is limited to $2\pi$, phase aliasing occurs, leading to discontinuities in phase images which are known as "phase wraps." Phase wraps may obscure phase features of a subject and need to be removed.

In conventional processes, a phase unwrapping operation may be performed on a phase difference between two images acquired at two different echo times. A field map may be determined based on a corrected phase difference and a time difference between the two echo times. However, the performance of a phase unwrapping algorithm depends highly on an assumption of spatial continuity of a phase image. The phase unwrapping algorithm is usually not effective when there are discontinuities in a region around the sinuses and within the skull or eyes and the brain. Therefore, it is desirable to provide effective systems and methods for determining a field map in MRI.

SUMMARY

According to an aspect of the present disclosure, a system for determining a field map in magnetic resonance imaging (MRI) may include at least one storage device storing a set of instructions, and at least one processor in communication with the at least one storage device. When executing the stored set of instructions, the at least one processor may cause the system to perform a method. The method may include obtaining at least three images. Each may be acquired at one of at least three echo times by an MRI device via scanning a subject. The at least three echo times may define multiple pairs of adjacent echo times. Each of the multiple pairs of adjacent echo times may have a time difference between the adjacent echo times, and at least two of the time differences are different. The method may include determining a target function with an off-resonance frequency as an independent variable. The target function may include a phase deviation term and a sparsity constraint term. The phase deviation term may be constructed based on multiple phase deviations. Each phase deviation may correspond to two images acquired at each pair of the multiple pairs of the adjacent echo times. The sparsity constraint term may be constructed based on at least one sparsity parameter of the off-resonance frequency in at least one transform domain.

In some embodiments, the method may include determining a field map by determining a target off-resonance frequency based on the target function.

In some embodiments, the method may include determining the phase deviation corresponding to two images acquired at each pair of adjacent echo times based on the off-resonance frequency, the two images acquired at the each pair of adjacent echo times, and the time difference corresponding to the each pair of adjacent echo times. The method may include determining the phase deviation term base on the phase deviation. The method may include determining the at least one sparsity parameter of the off-resonance frequency in the at least one transform domain. The method may include determining the sparsity constraint term based on the at least one sparsity parameter. The method may include determining the target function with the off-resonance frequency as the independent variable based on the phase deviation term and the sparsity constraint term.

In some embodiments, the method may include determining an estimated phase difference with an off-resonance frequency as an independent variable based on the time difference corresponding to the each pair of adjacent echo times. The method may include determining an actual phase difference based on values of corresponding pixels in the two images acquired at the each pair of adjacent echo times. The method may include determining the phase deviation corresponding to the each pair of adjacent echo times based on the estimated phase difference and the actual phase difference.

In some embodiments, the method may include determining a distance between the estimated phase difference and the actual phase difference. The method may include determining a Euclidean norm of the distance as the phase deviation.

In some embodiments, the method may include determining a weight corresponding to the each pair of adjacent echo times based on the two images acquired at the each pair of adjacent echo times. The method may include determining the phase deviation term by performing a weighted summation operation on the phase deviation corresponding to the each pair of adjacent echo times based on the weight corresponding to the each pair of adjacent echo times.

In some embodiments, the method may include processing the off-resonance frequency according to at least one of a variational method, a wavelet transform, a discrete Fourier transform, a discrete cosine transform, or a finite difference transform, to generate at least one processing result. The method may include determining the at least one sparsity parameter of the off-resonance frequency in the at least one transform domain based on the at least one processing result.

In some embodiments, the method may include determining the at least one sparsity parameter of the off-resonance frequency in the at least one transform domain based on a sum of absolute values of multiple elements in the at least one processing result.

In some embodiments, the method may include determining the sparsity constraint term by performing a weighted summation operation on the at least one sparsity parameter of the off-resonance frequency in the at least one transform domain.

In some embodiments, the method may include determining the target function by performing a weighted summation operation on the phase deviation term and the sparsity constraint term.

In some embodiments, the method may include determining, based on an initial off-resonance frequency, a minimum value of the target function. The method may include determining an off-resonance frequency corresponding to the minimum value of the target function as the target off-resonance frequency.

In some embodiments, the method may include obtaining at least three initial images. Each may be acquired at one of at least three initial echo times. The at least three initial echo times may define multiple pairs of adjacent initial echo times. Each pair of the multiple pairs of adjacent initial echo time may have a time difference between the adjacent initial echo times. The method may include determining the initial off-resonance frequency based on a phase difference between two initial images acquired at the each pair of the multiple pairs of adjacent initial echo times and the time difference corresponding to the each pair of the multiple pairs of adjacent initial echo times.

In some embodiments, the method may include, for each echo time of the at least three echo times, obtaining multiple candidate images. Each may be acquired at one of a plurality of channels of the MRI device. The method may include determining the image corresponding to the each echo time by combining the multiple candidate images acquired at the plurality of channels.

According to another aspect of the present disclosure, a method for determining a field map in magnetic resonance imaging (MRI) may be implemented on a computing device having one or more processors and one or more storage devices. The method may include obtaining at least three images. Each may be acquired at one of at least three echo times by an MRI device via scanning a subject. The at least three echo times may define multiple pairs of adjacent echo times. Each of the multiple pairs of adjacent echo times may have a time difference between the adjacent echo times, and at least two of the time differences are different. The method may include determining a target function with an off-resonance frequency as an independent variable. The target function may include a phase deviation term and a sparsity constraint term. The phase deviation term may be constructed based on multiple phase deviations. Each phase deviation may correspond to two images acquired at each pair of the multiple pairs of the adjacent echo times. The sparsity constraint term may be constructed based on at least one sparsity parameter of the off-resonance frequency in at least one transform domain.

In some embodiments, the method may include determining a field map by determining a target off-resonance frequency based on the target function.

In some embodiments, the method may include determining the phase deviation corresponding to two images acquired at each pair of adjacent echo times based on the off-resonance frequency, the two images acquired at the each pair of adjacent echo times, and the time difference corresponding to the each pair of adjacent echo times. The method may include determining the phase deviation term base on the phase deviation. The method may include determining the at least one sparsity parameter of the off-resonance frequency in the at least one transform domain. The method may include determining the sparsity constraint term based on the at least one sparsity parameter. The method may include determining the target function with the off-resonance frequency as the independent variable based on the phase deviation term and the sparsity constraint term.

In some embodiments, the method may include determining an estimated phase difference with an off-resonance frequency as an independent variable based on the time difference corresponding to the each pair of adjacent echo times. The method may include determining an actual phase difference based on values of corresponding pixels in the two images acquired at the each pair of adjacent echo times. The method may include determining the phase deviation corresponding to the each pair of adjacent echo times based on the estimated phase difference and the actual phase difference.

In some embodiments, the method may include determining a weight corresponding to the each pair of adjacent echo times based on the two images acquired at the each pair of adjacent echo times. The method may include determining the phase deviation term by performing a weighted summation operation on the phase deviation corresponding to the each pair of adjacent echo times based on the weight corresponding to the each pair of adjacent echo times.

In some embodiments, the method may include processing the off-resonance frequency according to at least one of a variational method, a wavelet transform, a discrete Fourier transform, a discrete cosine transform, or a finite difference transform, to generate at least one processing result. The method may include determining the at least one sparsity parameter of the off-resonance frequency in the at least one transform domain based on the at least one processing result.

According to still another aspect of the present disclosure, a non-transitory computer readable medium may include at least one set of instructions. When executed by at least one processor of a computing device, the at least one set of instructions may cause the at least one processor to effectuate a method. The method may include obtaining at least three images. Each may be acquired at one of at least three echo times by an MRI device via scanning a subject. The at least three echo times may define multiple pairs of adjacent echo times. Each of the multiple pairs of adjacent echo times may have a time difference between the adjacent echo times, and at least two of the time differences are different. The method may include determining a target function with an off-resonance frequency as an independent variable. The target function may include a phase deviation term and a sparsity constraint term. The phase deviation term may be constructed based on multiple phase deviations. Each phase deviation may correspond to two images acquired at each pair of the multiple pairs of the adjacent echo times. The sparsity constraint term may be constructed based on at least one sparsity parameter of the off-resonance frequency in at least one transform domain.

Additional features will be set forth in part in the description which follows, and in part will become apparent to those skilled in the art upon examination of the following and the accompanying drawings or may be learned by production or operation of the examples. The features of the present disclosure may be realized and attained by practice or use of various aspects of the methodologies, instrumentalities and combinations set forth in the detailed examples discussed below.

BRIEF DESCRIPTION OF THE DRAWINGS

The present disclosure is further described in terms of exemplary embodiments. These exemplary embodiments are described in detail with reference to the drawings. The drawings are not to scale. These embodiments are non-limiting exemplary embodiments, in which like reference numerals represent similar structures throughout the several views of the drawings, and wherein:

FIG. 7 is a flowchart illustrating an exemplary process for determining a phase deviation corresponding to a pair of adjacent echo times according to some embodiments of the present disclosure;

FIG. 9 is a schematic diagram illustrating exemplary field maps according to some embodiments of the present disclosure.

DETAILED DESCRIPTION

Figure 1:
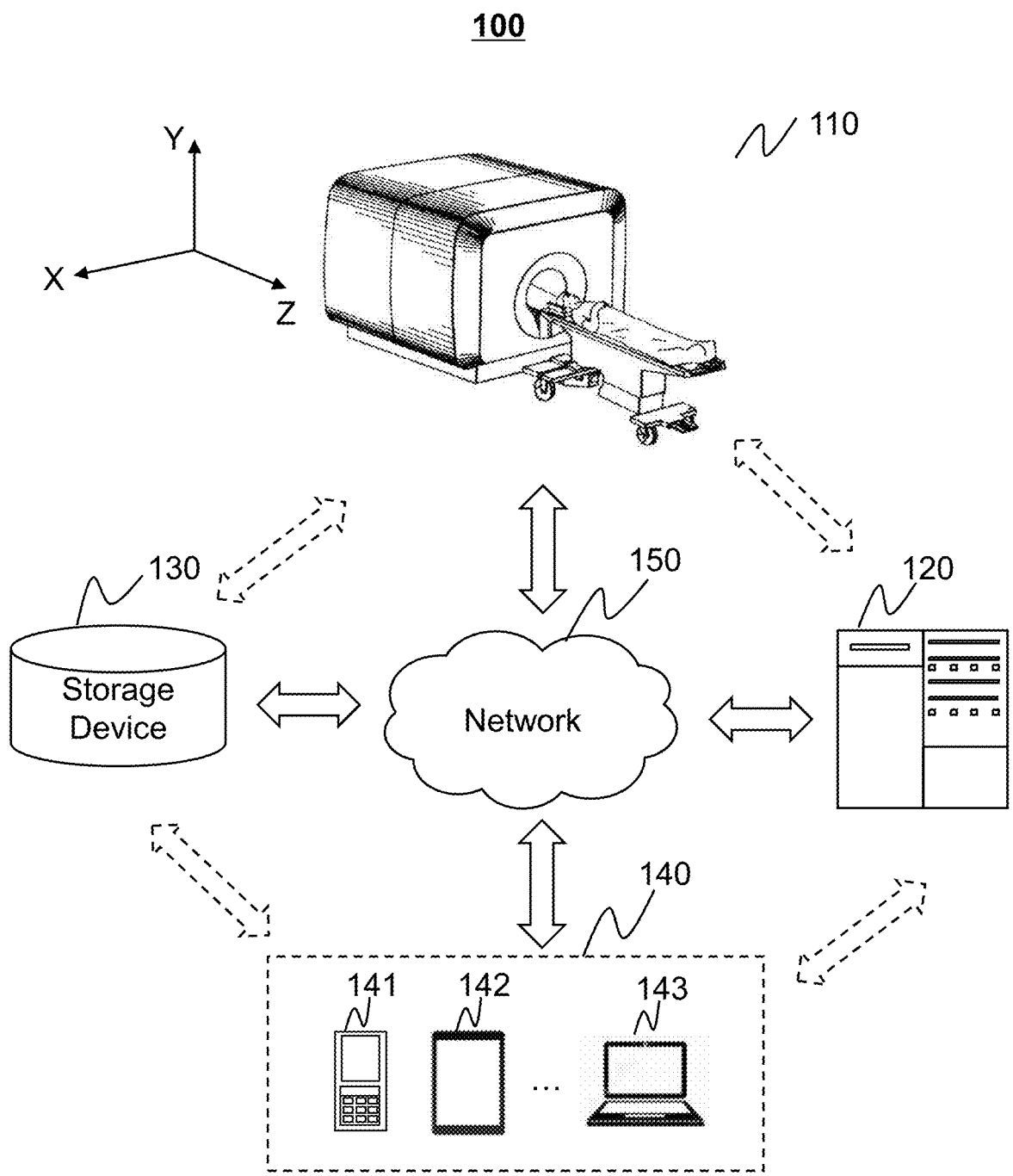
FIG. 1 is a schematic diagram illustrating an exemplary MRI system according to some embodiments of the present disclosure.

In the following detailed description, numerous specific details are set forth by way of examples in order to provide a thorough understanding of the relevant disclosure. However, it should be apparent to those skilled in the art that the present disclosure may be practiced without such details. In other instances, well-known methods, procedures, systems, components, and/or circuitry have been described at a relatively high-level, without detail, in order to avoid unnecessarily obscuring aspects of the present disclosure. Various modifications to the disclosed embodiments will be readily apparent to those skilled in the art, and the general principles defined herein may be applied to other embodiments and applications without departing from the spirit and scope of the present disclosure. Thus, the present disclosure is not limited to the embodiments shown, but to be accorded the widest scope consistent with the claims.

The terminology used herein is for the purpose of describing particular embodiments only and is not intended to be limiting of example embodiments of the invention. As used herein, the singular forms "a," "an," and "the," are intended to include the plural forms as well, unless the context clearly indicates otherwise. As used herein, the terms "and/or" and "at least one of" include any and all combinations of one or more of the associated listed items. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof. Also, the term "exemplary" is intended to refer to an example or illustration.

It will be understood that the terms "system," "engine," "unit," "module," and/or "block" used herein are one method to distinguish different components, elements, parts, sections or assembly of different levels in ascending order. However, the terms may be displaced by another expression if they achieve the same purpose.

Generally, the word "module," "unit," or "block," as used herein, refers to logic embodied in hardware or firmware, or to a collection of software instructions. A module, a unit, or a block described herein may be implemented as software and/or hardware and may be stored in any type of non-transitory computer-readable medium or another storage device. In some embodiments, a software module/unit/block may be compiled and linked into an executable program. It will be appreciated that software modules can be callable from other modules/units/blocks or from themselves, and/or may be invoked in response to detected events or interrupts. Software modules/units/blocks configured for execution on computing devices may be provided on a computer-readable medium, such as a compact disc, a digital video disc, a flash drive, a magnetic disc, or any other tangible medium, or as a digital download (and can be originally stored in a compressed or installable format that needs installation, decompression, or decryption prior to execution). Such software code may be stored, partially or fully, on a storage device of the executing computing device, for execution by the computing device. Software instructions may be embedded in firmware, such as an EPROM. It will be further appreciated that hardware modules/units/blocks may be included in connected logic components, such as gates and flip-flops, and/or can be included of programmable units, such as programmable gate arrays or processors. The modules/units/blocks or computing device functionality described herein may be implemented as software modules/units/blocks, but may be represented in hardware or firmware. In general, the modules/units/blocks described herein refer to logical modules/units/blocks that may be combined with other modules/units/blocks or divided into sub-modules/sub-units/sub-blocks despite their physical organization or storage. The description may be applicable to a system, an engine, or a portion thereof.

It will be understood that, although the terms "first," "second," "third," etc., may be used herein to describe various elements, these elements should not be limited by these terms. These terms are only used to distinguish one element from another. For example, a first element could be termed a second element, and, similarly, a second element could be termed a first element, without departing from the scope of exemplary embodiments of the present disclosure.

Spatial and functional relationships between elements are described using various terms, including "connected," "attached," and "mounted." Unless explicitly described as being "direct," when a relationship between first and second elements is described in the present disclosure, that relationship includes a direct relationship where no other intervening elements are present between the first and second elements, and also an indirect relationship where one or more intervening elements are present (either spatially or functionally) between the first and second elements. In contrast, when an element is referred to as being "directly" connected, attached, or positioned to another element, there are no intervening elements present. Other words used to describe the relationship between elements should be interpreted in a like fashion (e.g., "between," versus "directly between," "adjacent," versus "directly adjacent," etc.).

These and other features, and characteristics of the present disclosure, as well as the methods of operation and functions of the related elements of structure and the combination of parts and economies of manufacture, may become more apparent upon consideration of the following description with reference to the accompanying drawings, all of which form a part of this disclosure. It is to be expressly understood, however, that the drawings are for the purpose of illustration and description only and are not intended to limit the scope of the present disclosure. It is understood that the drawings are not to scale.

For illustration purposes, the following description is provided to help better understanding an artifact correction process. It is understood that this is not intended to limit the scope of the present disclosure. For persons having ordinary skills in the art, a certain amount of variations, changes and/or modifications may be deducted under the guidance of the present disclosure. Those variations, changes and/or modifications do not depart from the scope of the present disclosure.

Magnetic resonance imaging (MRI) may use a strong magnetic field and radio waves to create detailed images of organs and tissues within a subject. An MRI image may represent a field of 2-dimensional vector that has both a length and a direction. Length information may be displayed as a magnitude image. Directional information may be described with an angle called phase, forming a phase map behind every magnitude image. Mathematically, a two-dimensional vector may correspond to a complex number that has real and imaginary parts as those from a Fourier transform of k-space data acquired in a receiver coil of an MRI device. The fact that the measured phase of the MR signal can only be defined over a range spanning $2\pi$ rad means that values of the true phase, $\phi$, outside this range, become aliased.

A field map may be generated based on a plurality of phase images acquired at a plurality of echo times. In a common two-scan approach to generating a field map, two MRI scans with different echo times may be acquired. Two images may be reconstructed based on the two MRI scans. A field map may be determined by dividing a phase difference between the two images by a time difference between the two echo times. A limitation of the two-scan approach may be that the time difference between the two echo times involves a trade off. That is, if the time difference between the two echo times is relatively large, an undesirable phase wrapping may occur. If the time difference between the two echo times is relatively small, a variance of the field map may be relatively large.

Another exemplary approach employs a phase unwrapping operation. The phase unwrapping operation may be performed on a phase difference between two images acquired at two different echo times. The phase space of a phase image may be continuous by adjusting a phase with a period of $2\pi$. A field map may be determined according to Equation (1):

$$f = d\phi_{unwrap}/dTE_{12} = (\phi_2 - \phi_1)/(TE_2 - TE_1) \quad (1)$$

where f refers to a field map; $d\phi_{unwrap}$ refers to a corrected phase difference between a first image acquired at a first echo time and a second image acquired at a second echo time; $dTE_{12}$ refers to a time difference between the first echo time and the second echo time; and $\phi_1$ refers to a first phase image corresponding to the first image acquired at the first echo time; $\phi_2$ refers to a second phase image corresponding to the second image acquired at the second echo time; $TE_1$ refers to the first echo time; and $TE_2$ refers to the second echo time. An error of the field map may be determined according to Equation (2):

$$\Delta f = \sqrt{\Delta\phi_1^2 + \Delta\phi_2^2}/dTE_{12} \quad (2)$$

where $\Delta f$ refers to an error of the field map. However, the phase unwrapping algorithm have a plurality of problems. Firstly, the accuracy of the corrected phase difference may not be ensured. The corrected phase difference may be unwrapped with respect to a pre-selected seed point. However, a difference between a phase of the seed point and an actual phase may be $n*2\pi$, n may be an integer. In addition, since the phase unwrapping algorithm relies on an assumption of spatial continuity of a phase image. The phase unwrapping algorithm may not be effective when there are discontinuities in a phase image. For example, in a head MRI image, the phase unwrapping algorithm may not be effective when there are discontinuities in a region around the sinuses and between the skull or eyes and the brain.

Yet another exemplary approach involves obtaining phase images acquired at two or more echo times. For example, three phase images $\phi_1$, $\phi_2$, and $\phi_3$ may be obtained at three echo times $TE_1$, $TE_2$, and $TE_3$. Due to limitations of an MRI system, there are lower limits for a first time difference between $TE_1$ and $TE_2$, and a second time difference between $TE_2$ and $TE_3$. A first phase difference between $TE_1$ and $TE_2$ (i.e., $d\phi_{12} = \phi_2 - \phi_1$) may reflect a phase change corresponding to the first time difference between TE1 and TE2 (i.e., $dTE_{12} = TE_2 - TE_1$). If an off-resonance frequency exceeds $\frac{1}{2}dTE_{1,2}$, a phase accumulation corresponding to the first time difference $dTE_{12}$ may exceed $(-\pi, \pi)$, and a phase wrap may occur. $TE_3$ may be selected to make that the second time difference between $TE_2$ and $TE_3$ (i.e., $dTE_{23} = TE_3 - TE_2$) is larger (or smaller) than the first time difference between $TE_1$ and $TE_2$. A second phase difference between $TE_2$ and $TE_3$ (i.e., $d\phi_{23} = \phi_3 - \phi_2$) may be determined. If the off-resonance frequency exceeds $\frac{1}{2}dTE_{23}$, a phase wrap may occur. A difference (i.e., $d\phi_{12,23} = d\phi_{23} - d\phi_{12}$) between the first phase difference and the second phase difference may be determined. The difference $d\phi_{12,23}$ may reflect a phase change corresponding to a time difference of $dTE_{12,23} = dTE_{23} - dTE_{12} = TE_1 + TE_3 - 2TE_2$. If the off-resonance frequency is less than $\frac{1}{2}dTE_{12,23}$, a phase wrap may not occur. Since a length of the time difference $dTE_{12,23}$ is not limited by the MRI system, it can be small enough to avoid a phase wrap. The field map may be determined according to Equation (3):

$$f = d\phi_{12,23}/dTE_{12,23} = (\phi_1 + \phi_3 - 2\phi_2)/dTE_{12,23} \quad (3)$$

where f refers to a field map. An error of the field map may be determined according to Equation (4):

$$\Delta f = \sqrt{\Delta\phi_1^2 + \Delta\phi_3^2 + 4\Delta\phi_2^2}/dTE_{12,23} \quad (4)$$

where $\Delta f$ refers to an error of the field map. Accordingly, a phase wrap may be avoided based on phase images acquired at three echo times. However, the error of the field map may not be avoided.

Yet another exemplary approach utilizes a field map to perform an unwrapping operation on a plurality of phase images acquired at a plurality of echo times along a time direction. However, the performance of the phase unwrapping operation may depend on the accuracy of the field map.

An aspect of the present disclosure relates to a system and method for determining a field map in MRI. As used herein, a field map may refer to an image of an intensity of a magnetic field across space. According to some embodiments of the present disclosure, a processing device may obtain at least three images. Each image may be acquired at one of at least three echo times by an MRI device via scanning a subject. The at least three echo times may define multiple pairs of adjacent echo times. Each of the multiple pairs of adjacent echo times may have a time difference between the adjacent echo times. At least two of the time differences may be different. The processing device may determine a target function with an off-resonance frequency as an independent variable. The target function may include a phase deviation term and a sparsity constraint term. The phase deviation term may be constructed based on multiple phase deviations. Each phase deviation may correspond to two images acquired at each pair of the multiple pairs of the adjacent echo times. The sparsity constraint term may be constructed based on at least one sparsity parameter of the off-resonance frequency in at least one transform domain. The processing device may determine a field map by determining a target off-resonance frequency based on the target function.

Accordingly, a field map may be determined based on information associated with at least three images with different echo times. The dependence on an image space continuity and a seed point selection in the determination of the field map may be avoided. Accordingly, the stability of the determination process of the field map may be improved. In addition, a target function may be determined based on a phase deviation term in a time domain and a sparsity constraint term in at least one transform domain. The field map may be generated based on a target off-resonance frequency of the target function. By combining information in the time domain and information in the at least one transform domain, a signal to noise ratio of the field map may be improved.

FIG. 1 is a schematic diagram illustrating an exemplary MRI system according to some embodiments of the present disclosure. As illustrated, an MRI system 100 may include an MRI device 110, a processing device 120, a storage device 130, a terminal 140, and a network 150. The components of the MRI system 100 may be connected in one or more of various ways. Merely by way of example, as illustrated in FIG. 1, the MRI device 110 may be connected to the processing device 120 directly as indicated by the bi-directional arrow in dotted lines linking the MRI device 110 and the processing device 120, or through the network 150. As another example, the storage device 130 may be connected to the MRI device 110 directly as indicated by the bi-directional arrow in dotted lines linking the MRI device 110 and the storage device 130, or through the network 150. As still another example, the terminal 140 may be connected to the processing device 120 directly as indicated by the bi-directional arrow in dotted lines linking the terminal 140 and the processing device 120, or through the network 150.

The MRI device 110 may scan a subject located within its detection region and generate data relating to the subject. In the present disclosure, "subject" and "object" may be used interchangeably. In some embodiments, the subject may include a patient, a man-made object, etc. For example, the subject may include a specific portion, an organ, and/or tissue of a patient. As another example, the subject may include the head, the neck, the thorax, the heart, the stomach, a blood vessel, soft tissue, a tumor, nodules, or the like, or any combination thereof.

In the present disclosure, the X axis, the Y axis, and the Z axis shown in FIG. 1 may form an orthogonal coordinate system. The X axis and the Z axis shown in FIG. 1 may be horizontal, and the Y axis may be vertical. As illustrated, the positive X direction along the X axis may be from the right side to the left side of the MRI device 110 seen from the direction facing the front of the MRI device 110; the positive Y direction along the Y axis shown in FIG. 1 may be from the lower part to the upper part of the MRI device 110; the positive Z direction along the Z axis shown in FIG. 1 may refer to a direction in which the object is moved out of a scanning channel (or referred to as a bore) of the MRI device 110.

The MRI device 110 may include a magnet assembly, a gradient coil assembly, and a radiofrequency (RF) coil assembly (not shown in FIG. 1). In some embodiments, the MRI device 110 may be a close-bore scanner or an open-bore scanner. The magnet assembly may generate a first magnetic field (also referred to as a main magnetic field) for polarizing the subject to be scanned. The magnet assembly may include a permanent magnet, a superconducting electromagnet, a resistive electromagnet, etc. In some embodiments, the magnet assembly may further include shim coils for controlling the homogeneity of the main magnetic field.

The gradient coil assembly may generate a second magnetic field (also referred to as a gradient magnetic field). The gradient coil assembly may be designed for either a close-bore MRI scanner or an open-bore MRI scanner. The gradient coil assembly may include X-gradient coils, Y-gradient coils, and Z-gradient coils. The gradient coil assembly may generate one or more magnetic field gradient pulses to the main magnetic field in the X direction (Gx), Y direction (Gy), and Z direction (Gz) to encode the spatial information of the subject.

The RF coil assembly may include a plurality of RF coils. The RF coils may include one or more RF transmit coils and/or one or more RF receiver coils. The RF transmit coil(s) may transmit RF pulses to the subject. Under the coordinated action of the main magnetic field, the gradient magnetic field, and the RF pulses, MR signals relating to the subject may be generated. The RF receiver coils may receive MR signals from the subject. In some embodiments, one or more RF coils may both transmit RF pulses and receive MR signals at different times. In some embodiments, the function, size, type, geometry, position, amount, and/or magnitude of the RF coil(s) may be determined or changed according to one or more specific conditions. For example, according to the difference in function and size, the RF coil(s) may be classified as volume coils and local coils. The term "volume coil" as used herein generally refers to coils that are used to provide a homogenous RF excitation field across a relatively large volume, such as to cover the entire target body. For example, many commercially available MRI scanners include a volume coil that is big enough for whole body imaging of a human subject, thus sometimes is referred to as the "body coil". The term "local coil" as used herein generally refers to coils that are to be placed in close proximity to the region of interest during MR imaging. The local coils may be designed to achieve improved RF detection sensitivity over a small region of interest. In some embodiments, an RF receiver coil may correspond to a channel. The RF receiver coil(s) may receive a plurality of channels of MR signals from the subject. The received MR signal(s) may be sent to the processing device 120 directly or via the network 150 for image reconstruction and/or image processing.

The processing device 120 may process data and/or information obtained from the MRI device 110, the storage device 130, and/or the terminal(s) 140. For example, the processing device 120 may obtain at least three images. Each image may be acquired at one of at least three echo times by an MRI device via scanning a subject. As another example, the processing device 120 may determine a target function with an off-resonance frequency as an independent variable. As still another example, the processing device 120 may determine a field map by determining a target off-resonance frequency based on a target function.

In some embodiments, the processing device 120 may be a single server or a server group. The server group may be centralized or distributed. In some embodiments, the processing device 120 may be local or remote. For example, the processing device 120 may access information and/or data from the MRI device 110, the storage device 130, and/or the terminal(s) 140 via the network 150. As another example, the processing device 120 may be directly connected to the MRI device 110, the terminal(s) 140, and/or the storage device 130 to access information and/or data. In some embodiments, the processing device 120 may be implemented on a cloud platform. For example, the cloud platform may include a private cloud, a public cloud, a hybrid cloud, a community cloud, a distributed cloud, an inter-cloud, a multi-cloud, or the like, or a combination thereof. In some embodiments, the processing device 120 may be part of the terminal 140. In some embodiments, the processing device 120 may be part of the MRI device 110.

The storage device 130 may store data, instructions, and/or any other information. In some embodiments, the storage device 130 may store data obtained from the MRI device 110, the processing device 120, and/or the terminal(s) 140. The data may include image data acquired by the processing device 120, algorithms and/or models for processing the image data, etc. For example, the storage device 130 may store a plurality of images obtained from an MRI device (e.g., the MRI device 110). As another example, the storage device 130 may store a target function determined by the processing device 120. As still another example, the storage device 130 may store a field map determined by the processing device 120. In some embodiments, the storage device 130 may store data and/or instructions that the processing device 120 and/or the terminal 140 may execute or use to perform exemplary methods described in the present disclosure. In some embodiments, the storage device 130 may include a mass storage, removable storage, a volatile read-and-write memory, a read-only memory (ROM), or the like, or any combination thereof. Exemplary mass storage may include a magnetic disk, an optical disk, a solid-state drive, etc. Exemplary removable storage may include a flash drive, a floppy disk, an optical disk, a memory card, a zip disk, a magnetic tape, etc. Exemplary volatile read-and-write memories may include a random access memory (RAM). Exemplary RAM may include a dynamic RAM (DRAM), a double date rate synchronous dynamic RAM (DDR SDRAM), a static RAM (SRAM), a thyristor RAM (T-RAM), and a zero-capacitor RAM (Z-RAM), etc. Exemplary ROM may include a mask ROM (MROM), a programmable ROM (PROM), an erasable programmable ROM (EPROM), an electrically erasable programmable ROM (EEPROM), a compact disk ROM (CD-ROM), and a digital versatile disk ROM, etc. In some embodiments, the storage device 130 may be implemented on a cloud platform. Merely by way of example, the cloud platform may include a private cloud, a public cloud, a hybrid cloud, a community cloud, a distributed cloud, an inter-cloud, a multi-cloud, or the like, or any combination thereof.

In some embodiments, the storage device 130 may be connected to the network 150 to communicate with one or more other components in the MRI system 100 (e.g., the processing device 120, the terminal(s) 140). One or more components in the MRI system 100 may access the data or instructions stored in the storage device 130 via the network 150. In some embodiments, the storage device 130 may be integrated into the MRI device 110.

The terminal(s) 140 may be connected to and/or communicate with the MRI device 110, the processing device 120, and/or the storage device 130. In some embodiments, the terminal 140 may include a mobile device 141, a tablet computer 142, a laptop computer 143, or the like, or any combination thereof. For example, the mobile device 141 may include a mobile phone, a personal digital assistant (PDA), a gaming device, a navigation device, a point of sale (POS) device, a laptop, a tablet computer, a desktop, or the like, or any combination thereof. In some embodiments, the terminal 140 may include an input device, an output device, etc. The input device may include alphanumeric and other keys that may be input via a keyboard, a touchscreen (for example, with haptics or tactile feedback), a speech input, an eye tracking input, a brain monitoring system, or any other comparable input mechanism. Other types of the input device may include a cursor control device, such as a mouse, a trackball, or cursor direction keys, etc. The output device may include a display, a printer, or the like, or any combination thereof.

The network 150 may include any suitable network that can facilitate the exchange of information and/or data for the MRI system 100. In some embodiments, one or more components of the MRI system 100 (e.g., the MRI device 110, the processing device 120, the storage device 130, the terminal(s) 140, etc.) may communicate information and/or data with one or more other components of the MRI system 100 via the network 150. For example, the processing device 120 and/or the terminal 140 may obtain an image from the MRI device 110 via the network 150. As another example, the processing device 120 and/or the terminal 140 may obtain information stored in the storage device 130 via the network 150. The network 150 may be and/or include a public network (e.g., the Internet), a private network (e.g., a local area network (LAN), a wide area network (WAN)), etc.), a wired network (e.g., an Ethernet network), a wireless network (e.g., an 802.11 network, a Wi-Fi network, etc.), a cellular network (e.g., a Long Term Evolution (LTE) network), a frame relay network, a virtual private network (VPN), a satellite network, a telephone network, routers, hubs, witches, server computers, and/or any combination thereof. For example, the network 150 may include a cable network, a wireline network, a fiber-optic network, a telecommunications network, an intranet, a wireless local area network (WLAN), a metropolitan area network (MAN), a public telephone switched network (PSTN), a Bluetooth™ network, a ZigBee™ network, a near field communication (NFC) network, or the like, or any combination thereof. In some embodiments, the network 150 may include one or more network access points. For example, the network 150 may include wired and/or wireless network access points such as base stations and/or internet exchange points through which one or more components of the MRI system 100 may be connected to the network 150 to exchange data and/or information.

This description is intended to be illustrative, and not to limit the scope of the present disclosure. Many alternatives, modifications, and variations will be apparent to those skilled in the art. The features, structures, methods, and other characteristics of the exemplary embodiments described herein may be combined in various ways to obtain additional and/or alternative exemplary embodiments. However, those variations and modifications do not depart the scope of the present disclosure.

Figure 2:
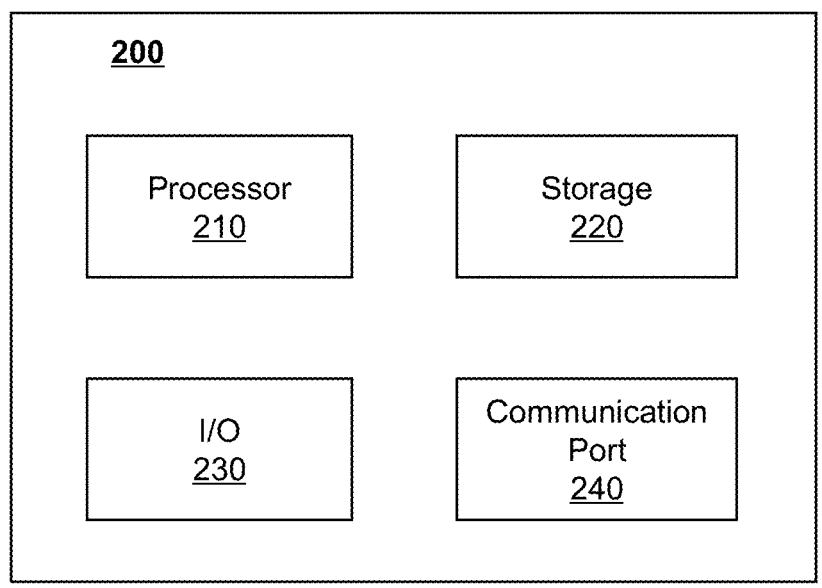
FIG. 2 is a schematic diagram illustrating exemplary hardware and/or software components of an exemplary computing device on which the processing device may be implemented according to some embodiments of the present disclosure.

FIG. 2 is a schematic diagram illustrating exemplary hardware and/or software components of an exemplary computing device 200 on which the processing device 120 may be implemented according to some embodiments of the present disclosure. As illustrated in FIG. 2, the computing device 200 may include a processor 210, a storage 220, an input/output (I/O) 230, and a communication port 240.

The processor 210 may execute computer instructions (e.g., program code) and perform functions of the processing device 120 in accordance with techniques described herein. The computer instructions may include, for example, routines, programs, objects, components, data structures, procedures, modules, and functions, which perform particular functions described herein. For example, the processor 210 may process imaging data obtained from the MRI device 110, the terminal(s) 140, the storage device 130, and/or any other component of the MRI system 100. In some embodiments, the processor 210 may include one or more hardware processors, such as a microcontroller, a microprocessor, a reduced instruction set computer (RISC), an application specific integrated circuits (ASICs), an application-specific instruction-set processor (ASIP), a central processing unit (CPU), a graphics processing unit (GPU), a physics processing unit (PPU), a microcontroller unit, a digital signal processor (DSP), a field programmable gate array (FPGA), an advanced RISC machine (ARM), a programmable logic device (PLD), any circuit or processor capable of executing one or more functions, or the like, or any combination thereof.

Merely for illustration, only one processor is described in the computing device 200. However, it should be noted that the computing device 200 in the present disclosure may also include multiple processors. Thus operations and/or method steps that are performed by one processor as described in the present disclosure may also be jointly or separately performed by the multiple processors. For example, if in the present disclosure the processor of the computing device 200 executes both process A and process B, it should be understood that process A and process B may also be performed by two or more different processors jointly or separately in the computing device 200 (e.g., a first processor executes process A and a second processor executes process B, or the first and second processors jointly execute processes A and B).

The storage 220 may store data/information obtained from the MRI device 110, the terminal(s) 140, the storage device 130, and/or any other component of the MRI system 100. The storage 220 may be similar to the storage device 130 described in connection with FIG. 1, and the detailed descriptions are not repeated here.

The I/O 230 may input and/or output signals, data, information, etc. In some embodiments, the I/O 230 may enable a user interaction with the processing device 120. In some embodiments, the I/O 230 may include an input device and an output device. Examples of the input device may include a keyboard, a mouse, a touchscreen, a microphone, a sound recording device, or the like, or a combination thereof. Examples of the output device may include a display device, a loudspeaker, a printer, a projector, or the like, or a combination thereof. Examples of the display device may include a liquid crystal display (LCD), a light-emitting diode (LED)-based display, a flat panel display, a curved screen, a television device, a cathode ray tube (CRT), a touchscreen, or the like, or a combination thereof.

The communication port 240 may be connected to a network (e.g., the network 150) to facilitate data communications. The communication port 240 may establish connections between the processing device 120 and the MRI device 110, the terminal(s) 140, and/or the storage device 130. The connection may be a wired connection, a wireless connection, any other communication connection that can enable data transmission and/or reception, and/or any combination of these connections. The wired connection may include, for example, an electrical cable, an optical cable, a telephone wire, or the like, or any combination thereof. The wireless connection may include, for example, a Bluetooth™ link, a Wi-Fi™ link, a WiMax™ link, a WLAN link, a ZigBee link, a mobile network link (e.g., 3G, 4G, 5G), or the like, or any combination thereof. In some embodiments, the communication port 240 may be and/or include a standardized communication port, such as RS232, RS485. In some embodiments, the communication port 240 may be a specially designed communication port. For example, the communication port 240 may be designed in accordance with the digital imaging and communications in medicine (DICOM) protocol.

Figure 3:
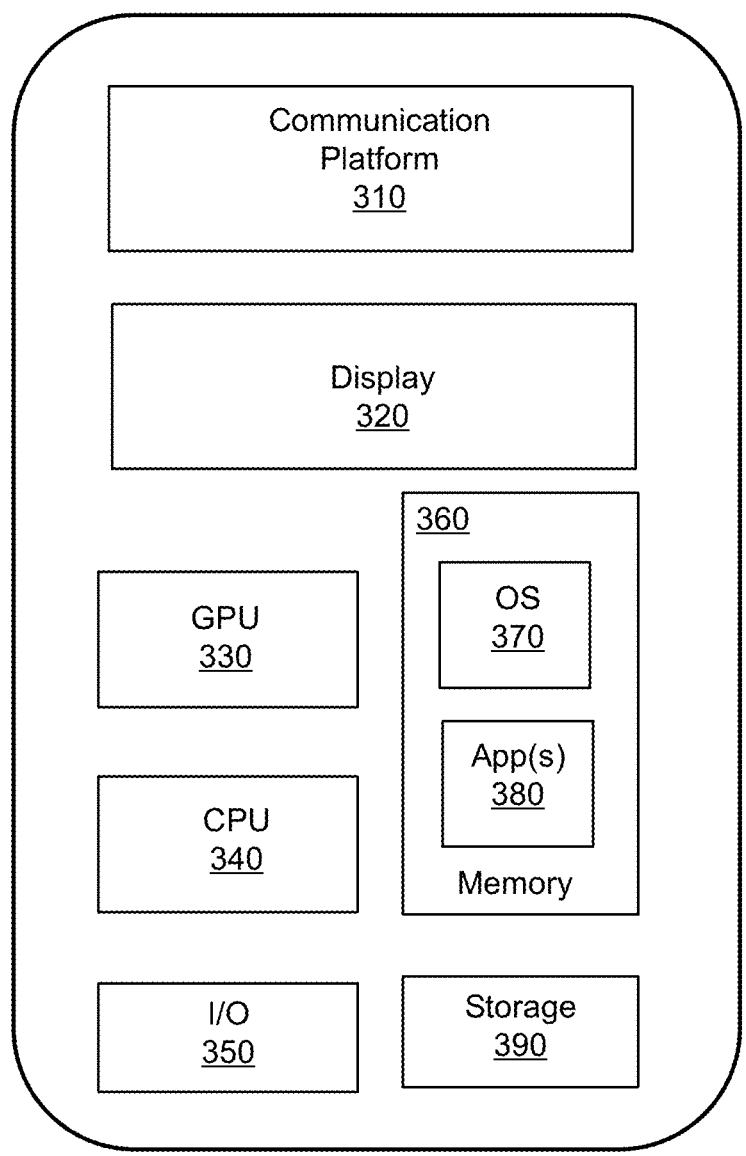
FIG. 3 is a schematic diagram illustrating exemplary hardware and/or software components of an exemplary mobile device on which the terminal(s) may be implemented according to some embodiments of the present disclosure.

FIG. 3 is a schematic diagram illustrating exemplary hardware and/or software components of an exemplary mobile device 300 on which the terminal(s) 140 may be implemented according to some embodiments of the present disclosure.

As illustrated in FIG. 3, the mobile device 300 may include a communication platform 310, a display 320, a graphics processing unit (GPU) 330, a central processing unit (CPU) 340, an I/O 350, a memory 360, and a storage 390. In some embodiments, any other suitable component, including but not limited to a system bus or a controller (not shown), may also be included in the mobile device 300.

In some embodiments, the communication platform 310 may be configured to establish a connection between the mobile device 300 and other components of the MRI system 100, and enable data and/or signal to be transmitted between the mobile device 300 and other components of the MRI system 100. For example, the communication platform 310 may establish a wireless connection between the mobile device 300 and the MRI device 110, and/or the processing device 120. The wireless connection may include, for example, a Bluetooth™ link, a Wi-Fi™ link, a WiMax™ link, a WLAN link, a ZigBee link, a mobile network link (e.g., 3G, 4G, 5G), or the like, or any combination thereof. The communication platform 310 may also enable the data and/or signal between the mobile device 300 and other components of the MRI system 100. For example, the communication platform 310 may transmit data and/or signals inputted by a user to other components of the MRI system 100. The inputted data and/or signals may include a user instruction. As another example, the communication platform 310 may receive data and/or signals transmitted from the processing device 120. The received data and/or signals may include imaging data acquired by a detector of the MRI device 110.

In some embodiments, a mobile operating system (OS) 370 (e.g., iOS™ Android™, Windows Phone™, etc.) and one or more applications (App(s)) 380 may be loaded into the memory 360 from the storage 390 in order to be executed by the CPU 340. The applications 380 may include a browser or any other suitable mobile apps for receiving and rendering information respect to a field map determination operation or other information from the processing device 120. User interactions with the information stream may be achieved via the I/O 350 and provided to the processing device 120 and/or other components of the MRI system 100 via the network 150.

To implement various modules, units, and their functionalities described in the present disclosure, computer hardware platforms may be used as the hardware platform(s) for one or more of the elements described herein. A computer with user interface elements may be used to implement a personal computer (PC) or another type of work station or terminal device, although a computer may also act as a server if appropriately programmed. It is believed that those skilled in the art are familiar with the structure, programming and general operation of such computer equipment and as a result the drawings should be self-explanatory.

Figure 4:
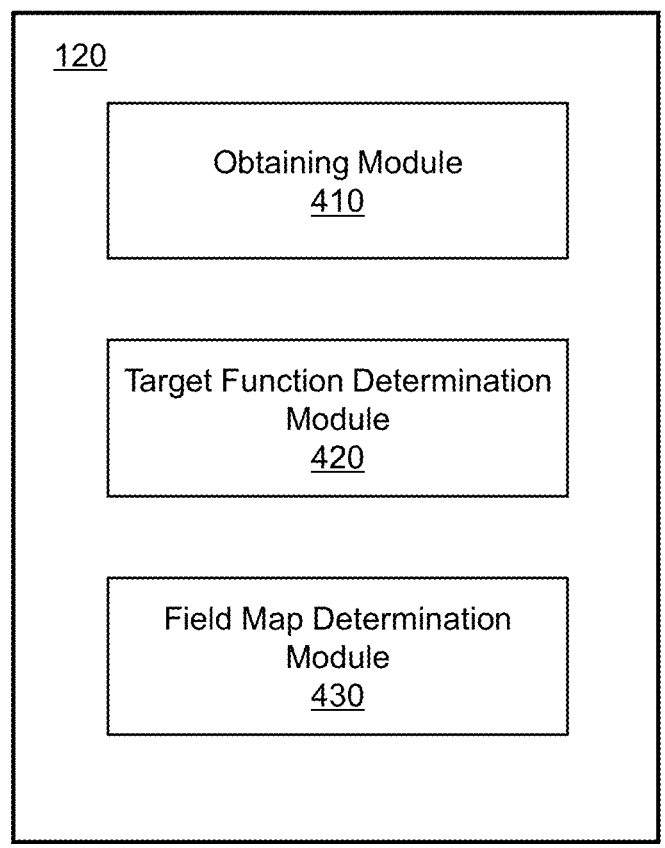
FIG. 4 is a schematic diagram illustrating an exemplary processing device according to some embodiments of the present disclosure.

FIG. 4 is a schematic diagram illustrating an exemplary processing device according to some embodiments of the present disclosure. In some embodiments, the processing device 120 may include an obtaining module 410, a target function determination module 420, and a field map determination module 430. The modules may be hardware circuits of at least part of the processing device 120. The modules may also be implemented as an application or set of instructions read and executed by the processing device 120. Further, the modules may be any combination of the hardware circuits and the application/instructions. For example, the modules may be part of the processing device 120 when the processing device 120 is executing the application or set of instructions.

The obtaining module 410 may be configured to obtain data and/or information associated with the MRI system 100. The data and/or information associated with the MRI system 100 may include an image, a target function, a field map, or the like, or any combination thereof. In some embodiments, the obtaining module 410 may obtain at least three images. Each image may be acquired at one of at least three echo times by an MRI device via scanning a subject. In some embodiments, the obtaining module 410 may obtain the data and/or the information associated with the MRI system 100 from one or more components (e.g., the MRI device 110, the storage device 130, the terminal 140) of the MRI system 100 via the network 150.

The target function determination module 420 may be configured to determine a target function. In some embodiments, the target function determination module 420 may determine a target function with an off-resonance frequency as an independent variable. The target function may include a phase deviation term and a sparsity constraint term. The phase deviation term may be constructed based on multiple phase deviations. Each phase deviation may correspond to two images acquired at each pair of multiple pairs of adjacent echo times. The sparsity constraint term may be constructed based on at least one sparsity parameter of the off-resonance frequency in at least one transform domain. More descriptions of the determination of the target function may be found elsewhere in the present disclosure (e.g., FIGS. 5-7, and descriptions thereof).

The field map determination module 430 may be configured to determine a field map. In some embodiments, the field map determination module 430 may determine a target off-resonance frequency based on a target function. For example, the field map determination module 430 may determine a minimum value of the target function based on an initial off-resonance frequency. The field map determination module 430 may determine an off-resonance frequency corresponding to the minimum value of the target function as the target off-resonance frequency. In some embodiments, the field map determination module 430 may determine a field map based on a target off-resonance frequency. More descriptions of the determination of the field map may be found elsewhere in the present disclosure (e.g., FIGS. 5, 6, and descriptions thereof).

It should be noted that the above description of the processing device 120 is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure. In some embodiments, one or more modules may be combined into a single module. For example, the target function determination module 420 and the field map determination module 430 may be combined into a single module, which may both determine a target function and a field map. In some embodiments, one or more modules may be added or omitted in the processing device 120. For example, the processing device 120 may further include a storage module (not shown in FIG. 4) configured to store data and/or information (e.g., a plurality of images, a target function, a field map) associated with the MRI system 100.

Figure 5:
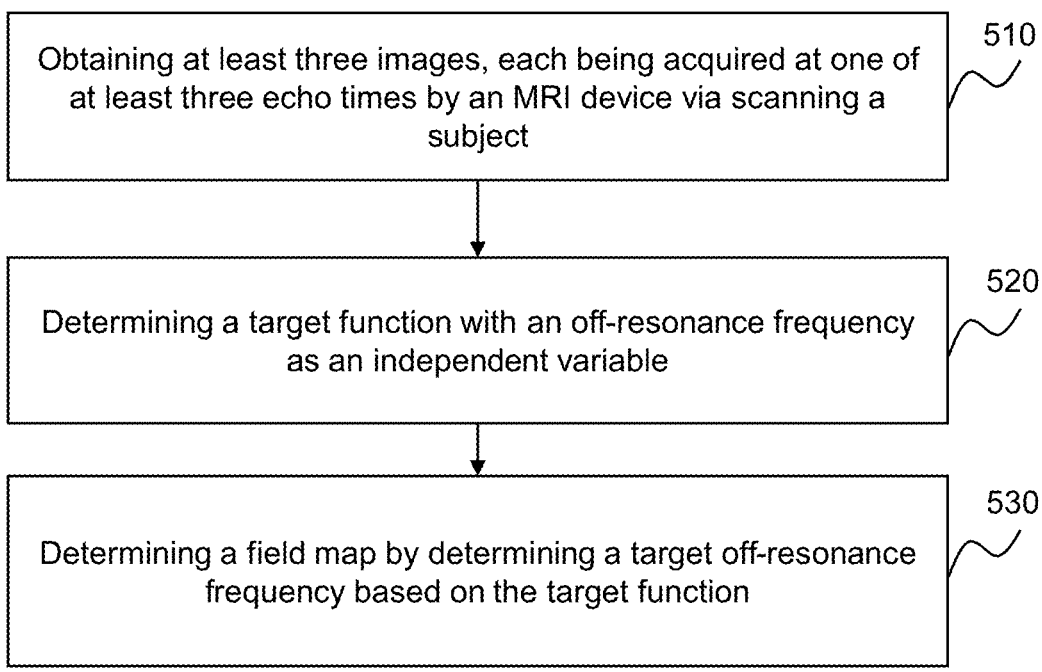
FIG. 5 is a flowchart illustrating an exemplary process for determining a field map according to some embodiments of the present disclosure.

FIG. 5 is a flowchart illustrating an exemplary process for determining a field map according to some embodiments of the present disclosure. In some embodiments, the process 500 may be implemented in the MRI system 100 illustrated in FIG. 1. For example, the process 500 may be stored in the storage device 130 and/or the storage (e.g., the storage 220, the storage 390) as a form of instructions, and invoked and/or executed by the processing device 120 (e.g., the processor 210 of the computing device 200 as illustrated in FIG. 2, the CPU 340 of the mobile device 300 as illustrated in FIG. 3). The operations of the illustrated process presented below are intended to be illustrative. In some embodiments, the process 500 may be accomplished with one or more additional operations not described, and/or without one or more of the operations discussed. Additionally, the order in which the operations of the process 500 as illustrated in FIG. 5 and described below is not intended to be limiting.

In 510, the processing device 120 (e.g., the obtaining module 410) may obtain at least three images. Each image may be acquired at one of at least three echo times by an MRI device via scanning a subject. The at least three echo times may define multiple pairs of adjacent echo times. For example, 3 echo times may define 2 pairs of adjacent echo time; 4 echo times may define 3 pairs of adjacent echo times, etc, as elaborated below. Each of the multiple pairs of adjacent echo times may have a time difference between the adjacent echo times. At least two of the time differences may be different from each other.

In some embodiments, the processing device 120 may obtain the at least three images from one or more components (e.g., the MRI device 110, the terminal 140, and/or the storage device 130) of the MRI system 100 or an external storage device via the network 150. For example, the MRI device 110 may transmit acquired imaging data (e.g., k-space data) to the storage device 130, or any other storage device for storage. The processing device 120 may obtain the imaging data from the storage device 130, or any other storage device and reconstruct the at least three images based on the imaging data. As another example, the processing device 120 may obtain the at least three images from the MRI device 110 directly. In some embodiments, the processing device 120 may obtain the at least three images from the I/O 230 of the computing device 200 via the communication port 240, and/or the I/O 350 of the mobile device 300 via the communication platform 310.

The MRI system 100 may include a main magnet assembly for providing a strong uniform main magnetic field to align the individual magnetic moments of the H atoms within a patient's body. During this process, the H atoms may oscillate around their magnetic poles at their characteristic Larmor frequency. If the tissue is subjected to an additional magnetic field, which is tuned to the Larmor frequency, the H atoms may absorb additional energy, which may rotate the net aligned moment of the H atoms. The additional magnetic field may be provided by an RF excitation signal (e.g., a RF signal generated by RF coils). When the additional magnetic field is removed, the magnetic moments of the H atoms may rotate back into alignment with the main magnetic field thereby emitting an MR signal, which may be referred to as a free induction decay (FID). A single RF pulse may generate a free induction decay (FID), but two successive RF pulses may produce a spin echo (SE). By varying the sequence of RF pulses applied and collected, different types of images may be generated. The time period between the middle of the excitation RF pulse and the peak of the spin echo may be referred to as an echo time (TE) (e.g., TE1, TE2, TE3 shown in FIG. 8). The echo time may be set manually by a user of the MRI system 100, or determined by one or more components (e.g., the processing device 120) of the MRI system 100.

In some embodiments, the at least three echo times may correspond to a same MRI scanning process—i.e. being acquired in the same process. In some embodiments, the at least three echo times may be continuous echo times in a same MRI scanning process. For example, the processing device 120 may determine a second echo time, a third echo time, and a fourth echo time in an MRI scanning process as the at least three echo time. In some embodiments, the at least three echo times may be discontinuous echo times in a same MRI scanning process. For example, the processing device 120 may determine a first echo time, a third echo time, and a ninth echo time in an MRI scanning process as the at least three echo times. In some embodiments, the at least three echo times may correspond to different MRI scanning processes.

In some embodiments, the at least three echo times may define multiple pairs of adjacent echo times. For example, the processing device 120 may rank the at least three echo times in an ascending order. The at least three echo times may form the multiple pairs of adjacent echo times based on the ranking of the at least time echo times. For illustration purposes, assuming that the processing device 120 obtains a first image acquired at $TE_1$, a second image acquired at $TE_2$, a third image acquired at $TE_3$, and $TE_1<TE_2<TE_3$, the three echo times $TE_1$, $TE_2$ and $TE_3$ may define a first pair of adjacent echo times $TE_1$ and $TE_2$, and a second pair of adjacent echo times $TE_2$ and $TE_3$.

In some embodiments, each of the multiple pairs of adjacent echo times may have a time difference between the adjacent echo times. At least two of the time differences may be different. For example, assuming that a time difference between a kth echo time (e.g., $TE_k$) and a (k+1)th echo time (e.g., $TE_{k+1}$) in a plurality of echo times is $dTE_{k,k+1}=TE_{k+1}-TE_k$, the processing device 120 may determine that a time difference between a mth echo time and a (m+1)th echo time is different from the time difference between the kth echo time and the (k+1)th echo time in the plurality of echo times, that is, $dTE_{k,k+1} \neq dTE_{m,m+1}$, $k \neq m$. More descriptions of the at least three echo times may be found elsewhere in the present disclosure (e.g., FIG. 8 and descriptions thereof).

In some embodiments, the at least three images may be MRI images. In some embodiments, each image of the at least three images may include a plurality of pixels. A value of each pixel may be a complex number (e.g., c=a+ib, a being a real component, and b being an imaginary component). A phase may be determined by $\theta=\overline{\arctan(b/a)}$, and a magnitude may be determined by $\sqrt{(a^2+b^2)}$. The phase and the magnitude may reflect an interaction between a subject to be scanned and a magnetic field generated by the MRI device (e.g., the MRI device 110). In some embodiments, a phase image and a magnitude image may be generated based on an MRI image. In some embodiments, the at least three images may be phase images.

In 520, the processing device 120 (e.g., the target function determination module 420) may determine a target function with an off-resonance frequency as an independent variable.

In some embodiments, the target function may include a phase deviation term and a sparsity constraint term. As used herein, the phase deviation term may reflect a degree of phase change of the at least three images in a time domain. The sparsity constraint term may reflect a degree of frequency change of the off-resonance frequency in at least one transform domain. The sparsity constraint term may be used to characterize a sparsity of the off-resonance frequency in the at least one transform domain.

In some embodiments, the phase deviation term may be constructed based on multiple phase deviations. Each phase deviation may correspond to two images acquired at each pair of the multiple pairs of the adjacent echo times. In some embodiments, the processing device 120 may determine the phase deviation corresponding to the two images acquired at the each pair of adjacent echo times based on the off-resonance frequency, the two images acquired at the each pair of adjacent echo times, and the time difference corresponding to the each pair of adjacent echo times. For example, the processing device 120 may determine an estimated phase difference with the off-resonance frequency as an independent variable based on the time difference corresponding to the each pair of adjacent echo times. The processing device 120 may determine an actual phase difference based on values of corresponding pixels in the two images acquired at the each pair of adjacent echo times. The processing device 120 may determine the phase deviation corresponding to the each pair of adjacent echo times based on the estimated phase difference and the actual phase difference. The processing device 120 may determine the phase deviation term based on the phase deviation corresponding to the each pair of adjacent echo times. For example, the processing device 120 may determine the phase deviation term by performing a weighted summation operation on the phase deviation corresponding to the each pair of adjacent echo times based on a weight corresponding to the each pair of adjacent echo times. More descriptions of the determination of the phase deviation term may be found elsewhere in the present disclosure (e.g., FIGS. 6, 7, and descriptions thereof).

In some embodiments, the sparsity constraint term may be constructed based on at least one sparsity parameter of the off-resonance frequency in at least one transform domain. For example, the processing device 120 may process the off-resonance frequency according to at least one of a variational method, a wavelet transform, a discrete Fourier transform, a discrete cosine transform, or a finite difference transform, to generate at least one processing result. The processing device 120 may determine the at least one sparsity parameter of the off-resonance frequency in the at least one transform domain based on the at least one processing result. More descriptions of the determination of the sparsity constraint term may be found elsewhere in the present disclosure (e.g., FIG. 6, and descriptions thereof).

In 530, the processing device 120 (e.g., the field map determination module 430) may determine a field map by determining a target off-resonance frequency based on the target function.

In some embodiments, the processing device 120 may determine a target off-resonance frequency based on the target function. For example, the processing device 120 may adjust a value of the target function by adjusting the independent variable (e.g., the off-resonance frequency) in the target function. In response to a determination that a value of the target function satisfies a preset condition, the processing device 120 may determine an off-resonance frequency corresponding to the value of the target function as the target off-resonance frequency. The preset condition may be that a value of the target function reaches a minimum value, a value of the target function reaches a maximum value, or the like. The preset condition may be determined by a user of the MRI system 100, or determined by one or more components (e.g., the processing device 120) of the MRI system 100 according to different situations. For example, the user of the MRI system 100 may determine the preset condition based on experience or actual needs. More descriptions of the determination of the target off-resonance frequency may be found elsewhere in the present disclosure (e.g., FIG. 6, and descriptions thereof).

The processing device 120 may determine a field map based on the target off-resonance frequency. In some embodiments, the processing device 120 may determine a target off-resonance frequency matrix based on the target function. The processing device 120 may determine an off-resonance frequency map based on the target off-resonance frequency matrix. The processing device 120 may determine the off-resonance frequency map as the field map. In some embodiments, the processing device 120 may determine a target off-resonance frequency for each pixel of a plurality pixels in an image. The processing device 120 may generate an off-resonance frequency map based on the plurality of target off-resonance frequencies. The processing device 120 may determine the off-resonance frequency map as the field map.

According to some embodiments of the present disclosure, a field map may be determined based on a degree of phase change of the at least three images in a time domain and a degree of frequency change of the off-resonance frequency in the at least one transform domain. Information in multiple dimensions (e.g., the time domain, the at least one transform domain) may be considered in the determination of the field map. The occurrence of abnormal points in the field map may be avoided. The space continuity of the field image may be improved, and a signal to noise ratio of the field map may also be improved. In addition, a field map determination process may be considered as an optimization problem. The dependence on an image space continuity and a seed point selection in the determination of the field map may be avoided. Phase wraps may also be avoided and an error of the field map may be reduced.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

In some embodiments, for each echo time of the at least three echo times, the processing device 120 may obtain multiple candidate images. Each candidate image may be acquired at one of a plurality of channels of an MRI device (e.g., the MRI device 110). As used herein, a channel of an MRI device may refer to a receiver pathway of the MRI device. The processing device 120 may determine the image corresponding to the each echo time by combining the multiple candidate images acquired at the plurality of channels. In some embodiments, the processing device 120 may combine the multiple candidate images according to one or more image combination algorithms. Exemplary image combination algorithms may include an adaptive reconstruction algorithm (e.g., an adaptive coil combination algorithm), a weighted mean algorithm, or the like. For example, the processing device 120 may determine a weight corresponding to each candidate image based on a magnitude of the each candidate image. The processing device 120 may determine a weighted candidate image based on the weight corresponding to each candidate image. The processing device 120 may determine an average image of multiple weighted candidate images as the image corresponding to the each echo time.

In some embodiments, for each pair of multiple pairs of adjacent echo times, the processing device 120 may determine a candidate phase deviation corresponding to two candidate images acquired at each channel of the plurality of channels of the MRI device (e.g., the MRI device 110). The processing device 120 may determine a weight of the candidate phase deviation corresponding to the two candidate images acquired at the each channel of the plurality of channels of the MRI device. For example, the processing device 120 may determine the weight of the candidate phase deviation based on magnitudes of the two candidate images acquired at the each channel of the plurality of channels of the MRI device. The processing device 120 may determine a target phase deviation corresponding to the each pair of adjacent echo times by performing a weighted summation operation on the candidate phase deviation corresponding to the two candidate images acquired at each channel of the plurality of channels of the MRI device based on the weight of the candidate phase deviation.

Figure 6:
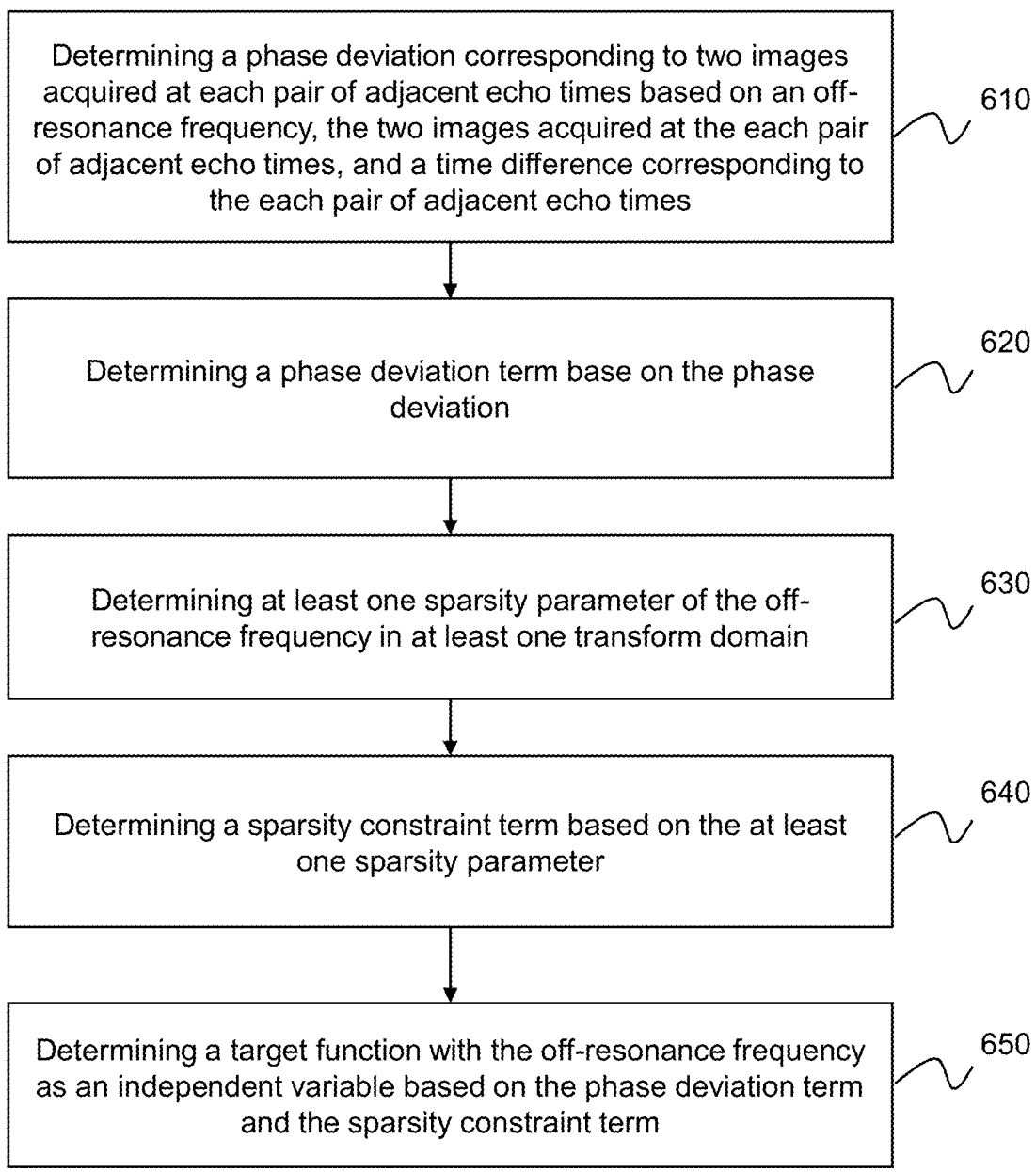
FIG. 6 is a flowchart illustrating an exemplary process for determining a target function according to some embodiments of the present disclosure.

FIG. 6 is a flowchart illustrating an exemplary process for determining a target function according to some embodiments of the present disclosure. In some embodiments, the process 600 may be implemented in the MRI system 100 illustrated in FIG. 1. For example, the process 600 may be stored in the storage device 130 and/or the storage (e.g., the storage 220, the storage 390) as a form of instructions, and invoked and/or executed by the processing device 120 (e.g., the processor 210 of the computing device 200 as illustrated in FIG. 2, the CPU 340 of the mobile device 300 as illustrated in FIG. 3). The operations of the illustrated process presented below are intended to be illustrative. In some embodiments, the process 600 may be accomplished with one or more additional operations not described, and/or without one or more of the operations discussed. Additionally, the order in which the operations of the process 600 as illustrated in FIG. 6 and described below is not intended to be limiting. In some embodiments, operation 520 illustrated in FIG. 5 may be performed according to the process 600.

In 610, the processing device 120 (e.g., the target function determination module 420) may determine a phase deviation corresponding to two images acquired at each pair of adjacent echo times based on an off-resonance frequency, the two images acquired at the each pair of adjacent echo times, and a time difference corresponding to the each pair of adjacent echo times.

In some embodiments, the processing device 120 may determine an estimated phase difference with an off-resonance frequency as an independent variable based on the time difference corresponding to the each pair of adjacent echo times. The processing device 120 may determine an actual phase difference based on values of corresponding pixels in the two images acquired at the each pair of adjacent echo times. The processing device 120 may determine the phase deviation corresponding to the each pair of adjacent echo times based on the estimated phase difference and the actual phase difference. More description of the determination of the phase deviation may be found elsewhere in the present disclosure (e.g., FIG. 7 and descriptions thereof).

In 620, the processing device 120 (e.g., the target function determination module 420) may determine a phase deviation term base on the phase deviation.

In some embodiments, the processing device 120 may determine a weight corresponding to the each pair of adjacent echo times. In some embodiments, the weight corresponding to the each pair of adjacent echo times may be a default parameter stored in a storage device (e.g., the storage device 130). Additionally or alternatively, the weight corresponding to the each pair of adjacent echo times may be set manually by a user of the MRI system 100, or determined by one or more components (e.g., the processing device 120) of the MRI system 100 according to different situations. For example, the user of the MRI system 100 may determine the weight corresponding to the each pair of adjacent echo times based on experience. As another example, the user of the MRI system 100 or the one or more components (e.g., the processing device 120) of the MRI system 100 may determine the weight corresponding to the each pair of adjacent echo times based on a plurality of experimental results.

In some embodiments, the processing device 120 may determine the weight corresponding to the each pair of adjacent echo times based on the two images acquired at the each pair of adjacent echo times. For example, the processing device 120 may determine the weight corresponding to the each pair of adjacent echo times based on magnitude information associated with the two images acquired at the each pair of adjacent echo times. For illustration purposes, the processing device 120 may determine the weight corresponding to the each pair of adjacent echo times according to Equation (5):

$$W_k = \left( \frac{A_k + A_{k+1}}{2} \right)^2 \quad (5)$$

where $W_k$ refers to a weight corresponding to two images acquired at a Kth echo time and a (K+1)th echo time; $A_k$ refers to a magnitude matrix corresponding to an image acquired at the Kth echo time; $A_{k+1}$ refers to a magnitude matrix corresponding to an image acquired at the (K+1)th echo time; and k refers to a serial number of echo time, k=1, 2, . . . , n−1, n≥3, wherein n refers to a maximum serial number of echo time.

In some embodiments, the weight corresponding to the each pair of adjacent echo times may be stored in one or more storage devices (e.g., the storage device 130) of the MRI system 100 or an external storage device. The processing device 120 may access the one or more storage devices of the MRI system 100 or the external storage device and retrieve the weight corresponding to the each pair of adjacent echo times.

The processing device 120 may determine the phase deviation term by performing a weighted summation operation on the phase deviation corresponding to the each pair of adjacent echo times based on the weight corresponding to the each pair of adjacent echo times. For example, the processing device 120 may determine the phase deviation term according to Equation (6):

$$G_1(f) = \Sigma_{k=1}^{n-1} W_k D_k \quad (6)$$

where $D_k$ refers to a phase deviation corresponding to the two images acquired at the Kth echo time and the (K+1)th echo time; $W_k$ refers to a weight corresponding to the two images acquired at the Kth echo time and the (K+1)th echo time; $G_1(f)$ refers to an phase deviation term; f refers to an off-resonance frequency; and k refers to a serial number of echo time, k=1, 2, . . . , n−1, n≥3, wherein n refers to a maximum serial number of echo time.

In 630, the processing device 120 (e.g., the target function determination module 420) may determine at least one sparsity parameter of the off-resonance frequency in at least one transform domain.

As used herein, a sparsity parameter of the off-resonance frequency in a transform may indicate a sparsity of the off-resonance frequency in the transform domain. The sparsity of the off-resonance frequency in the transform domain may reflect a degree of frequency change of the off-resonance frequency in the transform domain.

In some embodiments, the processing device 120 may process the off-resonance frequency according to at least one of a variational method, a wavelet transform, a discrete Fourier transform, a discrete cosine transform, or a finite difference transform, to generate at least one processing result. The processing device 120 may determine the at least one sparsity parameter of the off-resonance frequency in the at least one transform domain based on the at least one processing result. In some embodiments, the processing device 120 may determine the at least one sparsity parameter of the off-resonance frequency in the at least one transform domain based on a sum of absolute values of multiple elements in the at least one processing result. For example, the processing device 120 may determine a L1 norm of the off-resonance frequency in a transform domain as a sparsity parameter of the off-resonance frequency in the transform domain.

In 640, the processing device 120 (e.g., the target function determination module 420) may determine a sparsity constraint term based on the at least one sparsity parameter.

In some embodiments, the processing device 120 may determine a weight corresponding to each sparsity parameter of the at least one sparsity parameter of the off-resonance frequency in the at least one transform domain. In some embodiments, the weight corresponding to the each sparsity parameter of the at least one sparsity parameter may be a default parameter stored in a storage device (e.g., the storage device 130). Additionally or alternatively, the weight corresponding to the each sparsity parameter of the at least one sparsity parameter may be set manually by a user of the MRI system 100, or determined by one or more components (e.g., the processing device 120) of the MRI system 100 according to different situations. For example, the user of the MRI system 100 may determine the weight corresponding to the each sparsity parameter of the at least one sparsity parameter based on experience. As another example, the user of the MRI system 100 or the one or more components (e.g., the processing device 120) of the MRI system 100 may determine the weight corresponding to the each sparsity parameter of the at least one sparsity parameter based on a plurality of experimental results.

The processing device 120 may determine the sparsity constraint term by performing a weighted summation operation on the at least one sparsity parameter of the off-resonance frequency in the at least one transform domain. For example, the processing device 120 may determine the sparsity constraint term according to Equation (7):

$$G_2(f)=\Sigma_{j=1}^{m}\lambda_j \|\text{func}(f)\|_1 \qquad (7)$$

where $G_2(f)$ refers to a sparsity constraint term; $\lambda_j$ refers to a weight corresponding to each sparsity parameter of the at least one sparsity parameter; func refers to a transform domain algorithm; f refers to an off-resonance frequency; and j refers to a serial number of transform domain algorithm, j=1, 2, ..., m, wherein m refers to a total number of the at least one transform domain algorithm.

In 650, the processing device 120 (e.g., the target function determination module 420) may determine a target function with the off-resonance frequency as an independent variable based on the phase deviation term and the sparsity constraint term.

In some embodiments, the processing device 120 may determine the target function by performing a weighted summation operation on the phase deviation term and the sparsity constraint term. For example, the processing device 120 may determine a first weight corresponding to the phase deviation term. The processing device 120 may determine a second weight corresponding to the sparsity constraint term. The first weight (or the second weight) corresponding to the phase deviation term (or the sparsity constraint term) may reflect the importance of the phase deviation term (or the sparsity constraint term) in the determination of the target function. In some embodiments, the first weight and/or the second weight may be default parameters stored in a storage device (e.g., the storage device 130). Additionally or alternatively, the first weight and/or the second weight may be set manually by a user of the MRI system 100, or determined by one or more components (e.g., the processing device 120) of the MRI system 100 according to different situations. For example, the user of the MRI system 100 may determine the first weight and/or the second weight based on experience. As another example, the user of the MRI system 100 or the one or more components (e.g., the processing device 120) of the MRI system 100 may determine the first weight and/or the second weight based on a plurality of experimental results. The processing engine 120 may determine the target function based on the first weight, the second weight, the phase deviation term, and the sparsity constraint term. For example, the processing device 120 may determine the target function according to Equation (8):

$$G(f)=w_1 G_1(f)+w_2 G_2(f) \qquad (8)$$

where $G_1(f)$ refers to an phase deviation term; $G_2(f)$ refers to a sparsity constraint term; $w_1$ refers to a first weight corresponding to the phase deviation term; and $w_2$ refers to a second weight corresponding to the sparsity constraint term.

In some embodiments, the processing device 120 may determine a target off-resonance frequency based on the target function. In some embodiments, the processing device 120 may determine a minimum value of the target function based on an initial off-resonance frequency. In some embodiments, the initial off-resonance frequency may be a default parameter stored in a storage device (e.g., the storage device 130). Additionally or alternatively, the initial off-resonance frequency may be set manually by a user of the MRI system 100, or determined by one or more components (e.g., the processing device 120) of the MRI system 100 according to different situations. For example, the user of the MRI system 100 may determine the initial off-resonance frequency based on experience. As another example, the processing device 120 may determine the initial off-resonance frequency based on at least three initial images acquired by an MRI device (e.g., the MRI device 110) via scanning a subject.

In some embodiments, the processing device 120 may obtain the at least three initial images. The at least three initial images may be the same as or different from the at least three images as described in connection with operation 510. Each initial image of the at least three initial images may be acquired at one of at least three initial echo times. The at least three initial echo times may define multiple pairs of adjacent initial echo times. Each pair of the multiple pairs of adjacent initial echo time may have a time difference between the adjacent initial echo times. The processing device 120 may determine the initial off-resonance frequency based on a phase difference between two initial images acquired at the each pair of the multiple pairs of adjacent initial echo times and the time difference corresponding to the each pair of the multiple pairs of adjacent initial echo times. For example, the processing device 120 may determine the initial off-resonance frequency according to Equation (9):

$$\begin{cases} f_{start} = \dfrac{\Sigma_{i<j} a_{ij}(\phi_j - \phi_i)}{\Sigma_{i<j} a_{ij}(TE_j - TE_i)} \\ \Sigma_{i<j} a_{ij}(TE_j - TE_i) < T_{est} \end{cases} \qquad (9)$$

where $f_{start}$ refers to an initial off-resonance frequency; $a_{ij}$ refers to a preset real number; $\phi_j$ refers to a phase matrix corresponding to an image acquired at a jth echo time; $\phi_i$ refers to a phase matrix corresponding to an image acquired at a ith echo time; $TE_j$ refers to the jth echo time; $TE_i$ refers to the ith echo time; $T_{est}$ refers to a predetermined time difference that can avoid phase wraps; i and j refer to serial numbers of echo time.

In some embodiments, assuming that the processing device 120 obtains three initial images, and each initial image is acquired at one of three initial echo times, the processing device 120 may determine the initial off-resonance frequency according to Equation (10):

$$f_{start} = \dfrac{d\phi_{12,23}}{dTE_{12,23}} = \dfrac{\phi_1 + \phi_3 - 2\phi_2}{TE_1 + TE_3 - 2TE_2} \qquad (10)$$

where $f_{start}$ refers to an initial off-resonance frequency; $\phi_1$ refers to a first phase matrix corresponding to a first image acquired at a first echo time; $\phi_2$ refers to a second phase matrix corresponding to a second image acquired at a second echo time; $\phi_3$ refers to a third phase matrix corresponding to a third image acquired at a third echo time; $TE_1$ refers to the first echo time; $TE_2$ refers to the second echo time; $TE_3$ refers to the third echo time; $TE_{12}$ refers to a first time difference between the first echo time and the second echo time; $TE_{23}$ refers to a second time difference between the second echo time and the third echo time; $dTE_{12,23}$ refers to a third time difference between the first time difference and the second time difference. In some embodiments, the third time difference $dTE_{12,23}$ may be in a certain range to avoid phase wraps and reduce an error in the determination of the initial off-resonance frequency.

The processing device 120 may determine an off-resonance frequency corresponding to the minimum value of the target function as the target off-resonance frequency. The processing device 120 may determine a field map based on the target off-resonance frequency as described elsewhere in the present disclosure.

According to some embodiments of the present disclosure, a minimum value of a target function may be determined based on an initial off-resonance frequency. An off-resonance frequency corresponding to the minimum value of the target function may be determined as the target off-resonance frequency. By setting the initial off-resonance frequency, the speed of iterative convergence of a field map determination algorithm may be accelerated, and a robustness of the field map determination algorithm may be improved.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

FIG. 7 is a flowchart illustrating an exemplary process for determining a phase deviation corresponding to a pair of adjacent echo times according to some embodiments of the present disclosure. In some embodiments, the process 700 may be implemented in the MRI system 100 illustrated in FIG. 1. For example, the process 700 may be stored in the storage device 130 and/or the storage (e.g., the storage 220, the storage 390) as a form of instructions, and invoked and/or executed by the processing device 120 (e.g., the processor 210 of the computing device 200 as illustrated in FIG. 2, the CPU 340 of the mobile device 300 as illustrated in FIG. 3). The operations of the illustrated process presented below are intended to be illustrative. In some embodiments, the process 700 may be accomplished with one or more additional operations not described, and/or without one or more of the operations discussed. Additionally, the order in which the operations of the process 700 as illustrated in FIG. 7 and described below is not intended to be limiting. In some embodiments, operation 610 illustrated in FIG. 6 may be performed according to the process 700.

In 710, the processing device 120 (e.g., the target function determination module 420) may determine an estimated phase difference with an off-resonance frequency as an independent variable based on a time difference corresponding to each pair of adjacent echo times.

As used herein, "an estimated phase difference corresponding to two images acquired at a pair of adjacent echo times" may refer to an ideal phase difference between the two images determined in an ideal condition (e.g., in a condition of ignoring a mechanical error of an MRI device and/or an external environmental interference).

In some embodiments, the processing device 120 may determine the estimated phase difference according to Equation (11):

$$\begin{cases} \phi_{ek} = e^{2\pi i f dTE_{k,k+1}} \\ dTE_{k,k+1} = TE_{K+1} - TE_K \end{cases} \quad (11)$$

where $\phi_{ek}$ refers to an estimated phase difference corresponding to two images acquired at a Kth echo time and a (K+1)th echo time; $TE_{K+1}$ refers to the (K+1)th echo time; $TE_K$ refers to the Kth echo time; $dTE_{K,K+1}$ refers to a time difference corresponding to the Kth echo time and the (K+1)th echo time; f refers to an off-resonance frequency; and k refers to a serial number of echo time, k=1, 2, ..., n−1, n≥3, wherein n refers to a maximum serial number of echo time.

In 720, the processing device 120 (e.g., the target function determination module 420) may determine an actual phase difference based on values of corresponding pixels in two images acquired at the each pair of adjacent echo times.

As used herein, "an actual phase difference corresponding to two images acquired at a pair of adjacent echo times" may refer to a phase difference between the two images determined in an actual MRI scan condition (e.g., in an actual MRI scan environment without ignoring a mechanical error of an MRI device and/or an external environmental interference).

In some embodiments, the processing device 120 may determine the estimated phase difference according to Equation (12):

$$\begin{cases} \phi_{ak} = e^{2\pi i d\phi_{k,k+1}} \\ \phi_{k,k+1} = \phi_{K+1} - \phi_K \end{cases} \quad (12)$$

where $\phi_{ak}$ refers to an actual phase difference corresponding to two images acquired at a Kth echo time and a (K+1)th echo time; $\phi_{K+1}$ refers to a phase matrix of an image acquired at the (K+1)th echo time; $\phi_K$ refers to a phase matrix of an image acquired at the Kth echo time; $\phi_{KmK+1}$ refers to a phase difference matrix between the phase matrix of the image acquired at the (K+1)th echo time and the phase matrix of the image acquired at the Kth echo time; and k refers to a serial number of echo time, k=1, 2, ..., n−1, n≥3, wherein n refers to a maximum serial number of echo time.

In 730, the processing device 120 (e.g., the target function determination module 420) may determine a phase deviation corresponding to the each pair of adjacent echo times based on the estimated phase difference and the actual phase difference.

As used herein, "a phase deviation corresponding to two images acquired at a pair of adjacent echo times" may refer to a difference between an ideal phase difference between the two images in an ideal condition and an actual phase difference between the two images in an actual MRI scan condition.

In some embodiments, the processing device 120 may determine a distance between the estimated phase difference and the actual phase difference. The distance may be an Euclidean distance, or a Mahalanobis distance. As used herein, in mathematics, an Euclidean distance (also referred to as a Euclidean metric) may refer to a straight-line distance between two points in a Euclidean space. As used herein, a Mahalanobis distance may refer to a distance between two points in a multivariate space. The processing device 120 may determine an Euclidean norm of the distance as the phase deviation. For example, the processing device 120 may determine the phase deviation according to Equation (13):

$$D_k=\|\phi_{ek}-\phi_{ak}\|_2 \qquad (13)$$

where $\phi_{ak}$ refers to an actual phase difference corresponding to two images acquired at a Kth echo time and a (K+1)th echo time; $\phi_{ek}$ refers to an estimated phase difference corresponding to the two images acquired at the Kth echo time and the (K+1)th echo time; $D_k$ refers to a phase deviation corresponding to the two images acquired at the Kth echo time and the (K+1)th echo time.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

Figure 8:
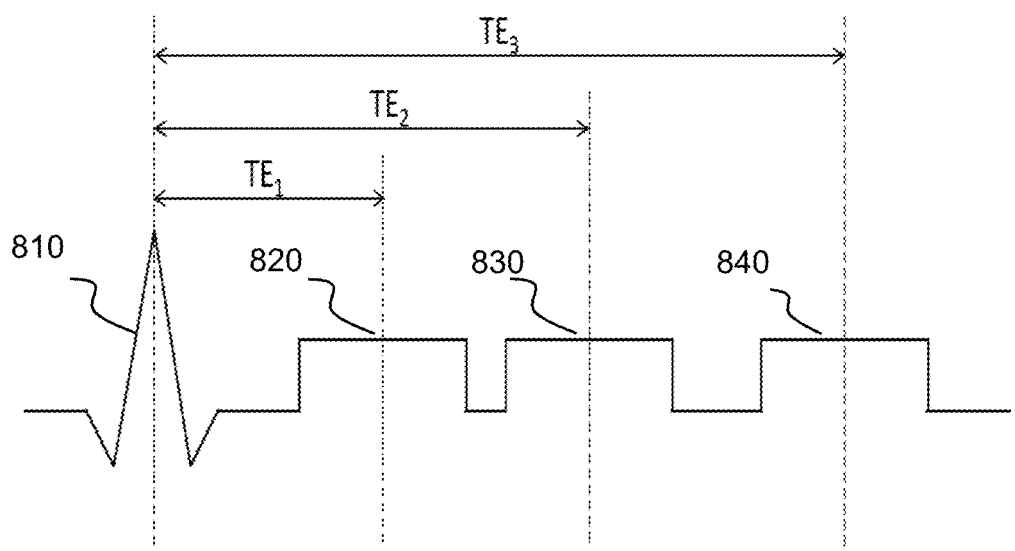
FIG. 8 is a schematic diagram illustrating exemplary echo times according to some embodiments of the present disclosure.

FIG. 8 is a schematic diagram illustrating exemplary echo times according to some embodiments of the present disclosure. As illustrated in FIG. 8, 810 refers to an excitation RF pulse, 820, 830, and 840 refer to a plurality of spin echoes. A first echo time $TE_1$ refers to a time between the middle of the excitation RF pulse 810 and a peak of the spin echo 820. A second echo time $TE_2$ refers to a time between the middle of the excitation RF pulse 810 and a peak of the spin echo 830. A third echo time $TE_3$ refers to a time between the middle of the excitation RF pulse 810 and a peak of the spin echo 840. The processing device 120 may determine a first time difference $dTE_{1,2}$ between the first echo time $TE_1$ and the second echo time $TE_2$. The processing device 120 may determine a second time difference $dTE_{2,3}$ between the second echo time $TE_2$ and the third echo time $TE_3$. In some embodiments, the first time difference $dTE_{1,2}$ may be different from the second time difference $dTE_{2,3}$. That is, the first echo time $TE_1$, the second echo time $TE_2$, and the third echo time TE3 may satisfy a condition below:

$$dTE_{2,3}-dTE_{1,2}=(TE_3-TE_2)-(TE_2-TE_1)\neq 0 \qquad (14)$$

where $TE_1$ refers to a first echo time; $TE_2$ refers to a second echo time; $TE_3$ refers to a third echo time; $dTE_{1,2}$ refers to a first time difference between the first echo time and the second echo time; and $dTE_{2,3}$ refers to a second time difference between the second echo time and the third echo time.

FIG. 9 is a schematic diagram illustrating exemplary field maps according to some embodiments of the present disclosure.

As illustrated in FIG. 9, 901 refers to a field map determined based on a traditional field map determination method. For example, a phase difference image between two images acquired at two echo times may be determined according to one or more phase unwrapping algorithms as described elsewhere in the present disclosure. The field map 901 may be determined based on the phase difference image and a time difference between the two echo times. The reference numeral 902 refers to a field map determined based on a first target function constructed based on a phase deviation term. The reference numeral 903 refers to a field map determined based on a second target function constructed based on a phase deviation term and a sparsity constraint term, as described elsewhere in the present disclosure.

Compared with the field map 901, the field map 902 may have a relatively low noise and a relatively good signal to noise ratio. However, since only a phase change in time domain is considered in the determination of the field map 902, compared with the field map 903, a spatial continuity of a local structure of the field map 902 may be relatively poor. Furthermore, an anomaly may occur at a point where the signal to noise ratio is relatively low in the field map 902. The spatial continuity of the field map 903 may be improved by introducing a sparsity constraint term corresponding to at least one transform domain in the second target function. The occurrence of an abnormal point in the field map 903 may be avoided, and the signal to noise ratio of the field map 903 may be improved.

It should be noted that the above description is merely provided for the purposes of illustration, and not intended to limit the scope of the present disclosure. For persons having ordinary skills in the art, multiple variations and modifications may be made under the teachings of the present disclosure. However, those variations and modifications do not depart from the scope of the present disclosure.

Having thus described the basic concepts, it may be rather apparent to those skilled in the art after reading this detailed disclosure that the foregoing detailed disclosure is intended to be presented by way of example only and is not limiting. Various alterations, improvements, and modifications may occur and are intended to those skilled in the art, though not expressly stated herein. These alterations, improvements, and modifications are intended to be suggested by this disclosure, and are within the spirit and scope of the exemplary embodiments of this disclosure.

Moreover, certain terminology has been used to describe embodiments of the present disclosure. For example, the terms "one embodiment," "an embodiment," and "some embodiments" mean that a particular feature, structure or characteristic described in connection with the embodiment is included in at least one embodiment of the present disclosure. Therefore, it is emphasized and should be appreciated that two or more references to "an embodiment" or "one embodiment" or "an alternative embodiment" in various portions of this specification are not necessarily all referring to the same embodiment. Furthermore, the particular features, structures or characteristics may be combined as suitable in one or more embodiments of the present disclosure.

Further, it will be appreciated by one skilled in the art, aspects of the present disclosure may be illustrated and described herein in any of a number of patentable classes or context including any new and useful process, machine, manufacture, or composition of matter, or any new and useful improvement thereof. Accordingly, aspects of the present disclosure may be implemented entirely hardware, entirely software (including firmware, resident software, micro-code, etc.) or combining software and hardware implementation that may all generally be referred to herein as a "module," "unit," "component," "device," or "system." Furthermore, aspects of the present disclosure may take the form of a computer program product embodied in one or more computer readable media having computer readable program code embodied thereon.

A computer readable signal medium may include a propagated data signal with computer readable program code embodied therein, for example, in baseband or as part of a carrier wave. Such a propagated signal may take any of a variety of forms, including electro-magnetic, optical, or the like, or any suitable combination thereof. A computer readable signal medium may be any computer readable medium that is not a computer readable storage medium and that may communicate, propagate, or transport a program for use by or in connection with an instruction execution system, apparatus, or device. Program code embodied on a computer readable signal medium may be transmitted using any appropriate medium, including wireless, wireline, optical fiber cable, RF, or the like, or any suitable combination of the foregoing.

Computer program code for carrying out operations for aspects of the present disclosure may be written in any combination of one or more programming languages, including an object oriented programming language such as Java, Scala, Smalltalk, Eiffel, JADE, Emerald, C++, C#, VB. NET, Python or the like, conventional procedural programming languages, such as the "C" programming language, Visual Basic, Fortran 2003, Perl, COBOL 2002, PHP, ABAP, dynamic programming languages such as Python, Ruby and Groovy, or other programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider) or in a cloud computing environment or offered as a service such as a Software as a Service (SaaS).

Furthermore, the recited order of processing elements or sequences, or the use of numbers, letters, or other designations therefore, is not intended to limit the claimed processes and methods to any order except as may be specified in the claims. Although the above disclosure discusses through various examples what is currently considered to be a variety of useful embodiments of the disclosure, it is to be understood that such detail is solely for that purpose, and that the appended claims are not limited to the disclosed embodiments, but, on the contrary, are intended to cover modifications and equivalent arrangements that are within the spirit and scope of the disclosed embodiments. For example, although the implementation of various components described above may be embodied in a hardware device, it may also be implemented as a software only solution, e.g., an installation on an existing server or mobile device.

Similarly, it should be appreciated that in the foregoing description of embodiments of the present disclosure, various features are sometimes grouped together in a single embodiment, figure, or description thereof for the purpose of streamlining the disclosure aiding in the understanding of one or more of the various embodiments. This method of disclosure, however, is not to be interpreted as reflecting an intention that the claimed subject matter requires more features than are expressly recited in each claim. Rather, claim subject matter lie in less than all features of a single foregoing disclosed embodiment.

We claim:

1. A system for determining a field map in magnetic resonance imaging (MRI), comprising:
at least one storage device storing a set of instructions; and
at least one processor in communication with the at least one storage device, when executing the stored set of instructions, the at least one processor causes the system to perform operations including:
obtaining at least three images, each being acquired at one of at least three echo times by an MRI device via scanning a subject, wherein the at least three echo times define multiple pairs of adjacent echo times, each of the multiple pairs of adjacent echo times has a time difference between the adjacent echo times, and at least two of the time differences are different; and
determining a target function with an off-resonance frequency as an independent variable,
wherein the target function includes a phase deviation term and a sparsity constraint term, the phase deviation term is constructed based on multiple phase deviations, each phase deviation corresponds to two images acquired at each pair of the multiple pairs of the adjacent echo times, and the sparsity constraint term is constructed based on at least one sparsity parameter of the off-resonance frequency in at least one transform domain.

2. The system of claim 1, the at least one processor causes the system to perform further operations including:
determining a field map by determining a target off-resonance frequency based on the target function.

3. The system of claim 2, wherein to determine a target off-resonance frequency based on the target function, the at least one processor causes the system to perform the operations including:
determining, based on an initial off-resonance frequency, a minimum value of the target function; and
determining an off-resonance frequency corresponding to the minimum value of the target function as the target off-resonance frequency.

4. The system of claim 3, the at least one processor causes the system to perform further operations including:
obtaining at least three initial images, each being acquired at one of at least three initial echo times, wherein the at least three initial echo times define multiple pairs of adjacent initial echo times, each pair of the multiple pairs of adjacent initial echo time has a time difference between the adjacent initial echo times; and
determining the initial off-resonance frequency based on a phase difference between two initial images acquired at the each pair of the multiple pairs of adjacent initial echo times and the time difference corresponding to the each pair of the multiple pairs of adjacent initial echo times.

5. The system of claim 1, wherein to determine a target function with an off-resonance frequency as an independent variable, the at least one processor causes the system to perform operations including:
determining the phase deviation corresponding to two images acquired at each pair of adjacent echo times based on the off-resonance frequency, the two images acquired at the each pair of adjacent echo times, and the time difference corresponding to the each pair of adjacent echo times;
determining the phase deviation term base on the phase deviation;
determining the at least one sparsity parameter of the off-resonance frequency in the at least one transform domain;
determining the sparsity constraint term based on the at least one sparsity parameter; and
determining the target function with the off-resonance frequency as the independent variable based on the phase deviation term and the sparsity constraint term.

6. The system of claim 5, wherein to determine a phase deviation corresponding to two images acquired at each pair of adjacent echo times based on the off-resonance frequency, the two image acquired at the each pair of adjacent echo times, and the time difference corresponding to the each pair of adjacent echo times, the at least one processor causes the system to perform operations including:
  determining an estimated phase difference with an off-resonance frequency as an independent variable based on the time difference corresponding to the each pair of adjacent echo times;
  determining an actual phase difference based on values of corresponding pixels in the two images acquired at the each pair of adjacent echo times; and
  determining the phase deviation corresponding to the each pair of adjacent echo times based on the estimated phase difference and the actual phase difference.

7. The system of claim 6, wherein to determine the phase deviation corresponding to the each pair of adjacent echo times based on the estimated phase difference and the actual phase difference, the at least one processor causes the system to perform operations including:
  determining a distance between the estimated phase difference and the actual phase difference; and
  determining a Euclidean norm of the distance as the phase deviation.

8. The system of claim 5, wherein to determine the phase deviation term base on the phase deviation corresponding to the each pair of adjacent echo times, the at least one processor causes the system to perform operations including:
  determining a weight corresponding to the each pair of adjacent echo times based on the two images acquired at the each pair of adjacent echo times; and
  determining the phase deviation term by performing a weighted summation operation on the phase deviation corresponding to the each pair of adjacent echo times based on the weight corresponding to the each pair of adjacent echo times.

9. The system of claim 5, wherein to determine the at least one sparsity parameter of the off-resonance frequency in the at least one transform domain, the at least one processor causes the system to perform operations including:
  processing the off-resonance frequency according to at least one of a variational method, a wavelet transform, a discrete Fourier transform, a discrete cosine transform, or a finite difference transform, to generate at least one processing result; and
  determining the at least one sparsity parameter of the off-resonance frequency in the at least one transform domain based on the at least one processing result.

10. The system of claim 9, wherein to determine the at least one sparsity parameter of the off-resonance frequency in the at least one transform domain based on the at least one processing result, the at least one processor causes the system to perform operations including:
  determining the at least one sparsity parameter of the off-resonance frequency in the at least one transform domain based on a sum of absolute values of multiple elements in the at least one processing result.

11. The system of claim 5, wherein to determine the sparsity constraint term based on the at least one sparsity parameter of the off-resonance frequency in at least one transform domain, the at least one processor causes the system to perform operations including:
  determining the sparsity constraint term by performing a weighted summation operation on the at least one sparsity parameter of the off-resonance frequency in the at least one transform domain.

12. The system of claim 5, wherein to determine the target function with the off-resonance frequency as the independent variable based on the phase deviation term and the sparsity constraint term, the at least one processor causes the system to perform operations including:
  determining the target function by performing a weighted summation operation on the phase deviation term and the sparsity constraint term.

13. The system of claim 1, wherein to obtain at least three images, the at least one processor causes the system to perform operations including:
  for each echo time of the at least three echo times, obtaining multiple candidate images, each being acquired at one of a plurality of channels of the MRI device; and
  determining the image corresponding to the each echo time by combining the multiple candidate images acquired at the plurality of channels.

14. A method for determining a field map in magnetic resonance imaging (MRI) implemented on a computing device having one or more processors and one or more storage devices, the method comprising:
  obtaining at least three images, each being acquired at one of at least three echo times by an MRI device via scanning a subject, wherein the at least three echo times define multiple pairs of adjacent echo times, each of the multiple pairs of adjacent echo times has a time difference between the adjacent echo times, and at least two of the time differences are different; and
  determining a target function with an off-resonance frequency as an independent variable,
  wherein the target function includes a phase deviation term and a sparsity constraint term, the phase deviation term is constructed based on multiple phase deviations, each phase deviation corresponds to two images acquired at each pair of the multiple pairs of the adjacent echo times, and the sparsity constraint term is constructed based on at least one sparsity parameter of the off-resonance frequency in at least one transform domain.

15. The method of claim 14, further comprising:
  determining a field map by determining a target off-resonance frequency based on the target function.

16. The method of claim 14, wherein determining a target function with an off-resonance frequency as an independent variable comprises:
  determining the phase deviation corresponding to two images acquired at each pair of adjacent echo times based on the off-resonance frequency, the two images acquired at the each pair of adjacent echo times, and the time difference corresponding to the each pair of adjacent echo times;
  determining the phase deviation term base on the phase deviation;
  determining the at least one sparsity parameter of the off-resonance frequency in the at least one transform domain;
  determining the sparsity constraint term based on the at least one sparsity parameter; and
  determining the target function with the off-resonance frequency as the independent variable based on the phase deviation term and the sparsity constraint term.

17. The method of claim 16, wherein determining a phase deviation corresponding to two images acquired at each pair of adjacent echo times based on the off-resonance frequency, the two image acquired at the each pair of adjacent echo times, and the time difference corresponding to the each pair of adjacent echo times comprises:

determining an estimated phase difference with an off-resonance frequency as an independent variable based on the time difference corresponding to the each pair of adjacent echo times;

determining an actual phase difference based on values of corresponding pixels in the two images acquired at the each pair of adjacent echo times; and determining the phase deviation corresponding to the each pair of adjacent echo times based on the estimated phase difference and the actual phase difference.

18. The method of claim 16, wherein determining the phase deviation term base on the phase deviation corresponding to the each pair of adjacent echo times comprises:

determining a weight corresponding to the each pair of adjacent echo times based on the two images acquired at the each pair of adjacent echo times; and determining the phase deviation term by performing a weighted summation operation on the phase deviation corresponding to the each pair of adjacent echo times based on the weight corresponding to the each pair of adjacent echo times.

19. The method of claim 16, wherein determining the at least one sparsity parameter of the off-resonance frequency in the at least one transform domain comprises:

processing the off-resonance frequency according to at least one of a variational method, a wavelet transform, a discrete Fourier transform, a discrete cosine transform, or a finite difference transform, to generate at least one processing result; and determining the at least one sparsity parameter of the off-resonance frequency in the at least one transform domain based on the at least one processing result.

20. A non-transitory computer readable medium, comprising at least one set of instructions, wherein when executed by at least one processor of a computing device, the at least one set of instructions cause the at least one processor to effectuate a method comprising:

obtaining at least three images, each being acquired at one of at least three echo times by an MRI device via scanning a subject, wherein the at least three echo times define multiple pairs of adjacent echo times, each of the multiple pairs of adjacent echo times has a time difference between the adjacent echo times, and at least two of the time differences are different; and determining a target function with an off-resonance frequency as an independent variable, wherein the target function includes a phase deviation term and a sparsity constraint term, the phase deviation term is constructed based on multiple phase deviations, each phase deviation corresponds to two images acquired at each pair of the multiple pairs of the adjacent echo times, and the sparsity constraint term is constructed based on at least one sparsity parameter of the off-resonance frequency in at least one transform domain.

* * * * *